(12) United States Patent
Kitamura

(10) Patent No.: US 6,388,588 B2
(45) Date of Patent: May 14, 2002

(54) ENCODING DEVICE AND ENCODING METHOD FOR CHANGING CODE AMOUNT OF COMPRESSED IMAGE DATA

(75) Inventor: Shinji Kitamura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/840,925

(22) Filed: Apr. 25, 2001

(30) Foreign Application Priority Data

Apr. 26, 2000 (JP) ........................................ 2000-125153

(51) Int. Cl.[7] .............................................. H03M 7/40
(52) U.S. Cl. ............................ 341/67; 341/50; 341/59; 341/65; 341/67; 382/244; 382/245; 382/246; 382/250; 382/251; 382/282
(58) Field of Search ............................ 341/50, 59, 65, 341/67; 382/244, 245, 246, 250, 251, 282

(56) References Cited

U.S. PATENT DOCUMENTS 4,750,212 A * 6/1988 Yokomizo ................... 382/56
5,440,345 A * 8/1995 Shimoda ..................... 348/411
5,452,007 A * 9/1995 Enari et al. .................. 348/405
5,754,235 A  5/1998 Urano et al.
5,933,536 A * 8/1999 Fukuzawa ................... 382/246
5,952,944 A * 9/1999 Nonaka et al. ............... 341/59

* cited by examiner

*Primary Examiner*—Michael Tokar
*Assistant Examiner*—Khai Nguyen
(74) *Attorney, Agent, or Firm*—McDermott, Will & Emery

(57) ABSTRACT

Compressed image data from a code memory is separated into quantization step values, code table information and variable-length codes. The variable-length codes are each decoded into a run length, a size and an additional bit string and written into a size memory. A size conversion section converts the run length, the size and the additional bit string from the size memory based on a frequency region and a size conversion amount set in a size conversion table. A variable-length code is assigned to each converted run length/size combination, and an additional bit string is attached thereto, thereby producing a variable-length code. The variable-length codes, the quantization step values and the code table information are multiplexed together to produce compressed image data.

14 Claims, 33 Drawing Sheets

FIG. 4

| 2 | 2 | 3 | 3 | 4 | 4 | 6 | 6 |
|---|---|---|---|---|---|---|---|
| 2 | 3 | 3 | 4 | 4 | 6 | 6 | 8 |
| 3 | 3 | 4 | 4 | 6 | 6 | 8 | 8 |
| 3 | 4 | 4 | 6 | 6 | 8 | 8 | 10 |
| 4 | 4 | 6 | 6 | 8 | 8 | 10 | 10 |
| 4 | 6 | 6 | 8 | 8 | 10 | 10 | 10 |
| 6 | 6 | 8 | 8 | 10 | 10 | 10 | 20 |
| 6 | 8 | 8 | 10 | 10 | 10 | 20 | 30 |

FIG. 5

| Run length/size | Code length | Code word | Run length/size | Code length | Code word |
|---|---|---|---|---|---|
| 0/0(EOB) | 4 | 1010 | | | |
| 0/1 | 2 | 00 | 5/1 | 7 | 1111010 |
| 0/2 | 2 | 01 | 5/2 | 11 | 11111110111 |
| 0/3 | 3 | 100 | 5/3 | 16 | 1111111110011110 |
| 0/4 | 4 | 1011 | 5/4 | 16 | 1111111110011111 |
| 0/5 | 5 | 11010 | 5/5 | 16 | 1111111110100000 |
| 0/6 | 7 | 1111000 | 5/6 | 16 | 1111111110100001 |
| 0/7 | 8 | 11111000 | 5/7 | 16 | 1111111110100010 |
| 0/8 | 10 | 1111110110 | 5/8 | 16 | 1111111110100011 |
| 0/9 | 16 | 1111111110000010 | 5/9 | 16 | 1111111110100100 |
| 0/A | 16 | 1111111110000011 | 5/A | 16 | 1111111110100101 |
| 1/1 | 4 | 1100 | 6/1 | 7 | 1111011 |
| 1/2 | 5 | 11011 | 6/2 | 12 | 111111110110 |
| 1/3 | 7 | 1111001 | 6/3 | 16 | 1111111110100110 |
| 1/4 | 9 | 111110110 | 6/4 | 16 | 1111111110100111 |
| 1/5 | 11 | 11111110110 | 6/5 | 16 | 1111111110101000 |
| 1/6 | 16 | 1111111110000100 | 6/6 | 16 | 1111111110101001 |
| 1/7 | 16 | 1111111110000101 | 6/7 | 16 | 1111111110101010 |
| 1/8 | 16 | 1111111110000110 | 6/8 | 16 | 1111111110101011 |
| 1/9 | 16 | 1111111110000111 | 6/9 | 16 | 1111111110101100 |
| 1/A | 16 | 1111111110001000 | 6/A | 16 | 1111111110101101 |
| 2/1 | 5 | 11100 | 7/1 | 8 | 11111010 |
| 2/2 | 8 | 11111001 | 7/2 | 12 | 111111110111 |
| 2/3 | 10 | 1111110111 | 7/3 | 16 | 1111111110101110 |
| 2/4 | 12 | 111111110100 | 7/4 | 16 | 1111111110101111 |
| 2/5 | 16 | 1111111110001001 | 7/5 | 16 | 1111111110110000 |
| 2/6 | 16 | 1111111110001010 | 7/6 | 16 | 1111111110110001 |
| 2/7 | 16 | 1111111110001011 | 7/7 | 16 | 1111111110110010 |
| 2/8 | 16 | 1111111110001100 | 7/8 | 16 | 1111111110110011 |
| 2/9 | 16 | 1111111110001101 | 7/9 | 16 | 1111111110110100 |
| 2/A | 16 | 1111111110001110 | 7/A | 16 | 1111111110110101 |
| 3/1 | 6 | 111010 | 8/1 | 9 | 111111000 |
| 3/2 | 9 | 111110111 | 8/2 | 15 | 111111111000000 |
| 3/3 | 12 | 111111110101 | 8/3 | 16 | 1111111110110110 |
| 3/4 | 16 | 1111111110001111 | 8/4 | 16 | 1111111110110111 |
| 3/5 | 16 | 1111111110010000 | 8/5 | 16 | 1111111110111000 |
| 3/6 | 16 | 1111111110010001 | 8/6 | 16 | 1111111110111001 |
| 3/7 | 16 | 1111111110010010 | 8/7 | 16 | 1111111110111010 |
| 3/8 | 16 | 1111111110010011 | 8/8 | 16 | 1111111110111011 |
| 3/9 | 16 | 1111111110010100 | 8/9 | 16 | 1111111110111100 |
| 3/A | 16 | 1111111110010101 | 8/A | 16 | 1111111110111101 |
| 4/1 | 6 | 111011 | 9/1 | 9 | 111111001 |
| 4/2 | 10 | 1111111000 | 9/2 | 16 | 1111111110111110 |
| 4/3 | 16 | 1111111110010110 | 9/3 | 16 | 1111111110111111 |
| 4/4 | 16 | 1111111110010111 | 9/4 | 16 | 1111111111000000 |
| 4/5 | 16 | 1111111110011000 | 9/5 | 16 | 1111111111000001 |
| 4/6 | 16 | 1111111110011001 | ( | ( | ( |
| 4/7 | 16 | 1111111110011010 | ) | ) | ) |
| 4/8 | 16 | 1111111110011011 | F/8 | 16 | 1111111111111100 |
| 4/9 | 16 | 1111111110011100 | F/9 | 16 | 1111111111111101 |
| 4/A | 16 | 1111111110011101 | F/A | 16 | 1111111111111110 |

FIG. 6

| 255 | 0 | 255 | 0 | 255 | 0 | 255 | 0 |
|---|---|---|---|---|---|---|---|
| 0 | 255 | 0 | 255 | 0 | 255 | 0 | 255 |
| 255 | 0 | 255 | 0 | 255 | 0 | 255 | 0 |
| 0 | 255 | 0 | 255 | 0 | 255 | 0 | 255 |
| 255 | 0 | 255 | 0 | 255 | 0 | 255 | 0 |
| 0 | 255 | 0 | 255 | 0 | 255 | 0 | 255 |
| 255 | 0 | 255 | 0 | 255 | 0 | 255 | 0 |
| 0 | 255 | 0 | 255 | 0 | 255 | 0 | 255 |

FIG. 7

| -4 | 0 | 0 | 0 | 0 | 0 | 0 | 0 |
|---|---|---|---|---|---|---|---|
| 0 | 33 | 0 | 39 | 0 | 59 | 0 | 167 |
| 0 | 0 | 0 | 0 | 0 | 0 | 0 | 0 |
| 0 | 39 | 0 | 46 | 0 | 69 | 0 | 197 |
| 0 | 0 | 0 | 0 | 0 | 0 | 0 | 0 |
| 0 | 59 | 0 | 69 | 0 | 103 | 0 | 294 |
| 0 | 0 | 0 | 0 | 0 | 0 | 0 | 0 |
| 0 | 167 | 0 | 197 | 0 | 294 | 0 | 837 |

FIG. 8

| -2 | 0  | 0 | 0  | 0 | 0  | 0 | 0  |
|----|----|---|----|---|----|---|----|
| 0  | 11 | 0 | 10 | 0 | 10 | 0 | 21 |
| 0  | 0  | 0 | 0  | 0 | 0  | 0 | 0  |
| 0  | 10 | 0 | *8 | 0 | 9  | 0 | 20 |
| 0  | 0  | 0 | 0  | 0 | 0  | 0 | 0  |
| 0  | 10 | 0 | 9  | 0 | 10 | 0 | 30 |
| 0  | 0  | 0 | 0  | 0 | 0  | 0 | 0  |
| 0  | 21 | 0 | 20 | 0 | 30 | 0 | 28 |

| -2 | - | - | - | - | - | - | - |
|---|---|---|---|---|---|---|---|
| - | 3/11 | - | 1/10 | - | 1/10 | - | 1/21 |
| - | - | - | - | - | - | - | - |
| - | 6/10 | - | 1/8 | - | 1/9 | - | 1/20 |
| - | - | - | - | - | - | - | - |
| - | 8/10 | - | 1/9 | - | 1/10 | - | 1/30 |
| - | - | - | - | - | - | - | - |
| - | 9/21 | - | 6/20 | - | 4/30 | - | 2/28 |

FIG. 11

| Size SSSS | Quantized DCT coefficient value $S_q$ | Number of additional bits |
|---|---|---|
| 0 | 0 | 0 |
| 1 | -1、+1 | 1 |
| 2 | -3、-2、+2、+3 | 2 |
| 3 | -7、・・-4、+4、・・、+7 | 3 |
| 4 | -15、・・、-8、+8、・・、+15 | 4 |
| 5 | -31、・・、-16、+16、・・、+31 | 5 |
| 6 | -63、・・、-32、+32、・・、+63 | 6 |
| 7 | -127、・・、-64、+64、・・、+127 | 7 |
| 8 | -255、・・、-128、+128、・・、+255 | 8 |
| 9 | -511、・・、-256、+256、・・、+511 | 9 |
| 10 | -1023、・・、-512、+512、・・、+1023 | 10 |
| 11 | -2047、・・、-1024、+1024、・・、+2047 | 11 |

FIG. 12

| 2 | - | - | - | - | - | - | - |
|---|---|---|---|---|---|---|---|
| - | 3/4 (4) | - | 1/4 (4) | - | 1/4 (4) | - | 1/5 (5) |
| - | - | - | - | - | - | - | - |
| - | 6/4 (4) | - | 1/4 (4) | - | 1/4 (4) | - | *1/5 (5) |
| - | - | - | - | - | - | - | - |
| - | 8/4 (4) | - | 1/4 (4) | - | *1/4 (4) | - | 1/5 (5) |
| - | - | - | - | - | - | - | - |
| - | 9/5 (5) | - | 6/5 (5) | - | 4/5 (5) | - | 2/5 (5) |

FIG. 14

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -1 |
| 0 | 0 | 0 | 0 | -1 | -1 | -1 | -2 |
| 0 | 0 | 0 | -1 | -1 | -1 | -2 | -2 |
| 0 | 0 | -1 | -1 | -1 | -2 | -2 | -2 |

| 2 | – | – | – | – | – | – | – |
|---|---|---|---|---|---|---|---|
| – | 3/4 (4) | – | 1/4 (4) | – | 1/4 (4) | – | 1/5 (5) |
| – | – | – | – | – | – | – | – |
| – | 6/4 (4) | – | 1/4 (4) | – | 1/4 (4) | – | 1/4 (4) |
| – | – | – | – | – | – | – | – |
| – | 8/4 (4) | – | 1/4 (4) | – | 1/3 (3) | – | 1/3 (3) |
| – | – | – | – | – | – | – | – |
| – | 9/5 (5) | – | 6/4 (4) | – | 4/3 (3) | – | 2/3 (3) |

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | -4 |
| 0 | 0 | 0 | 0 | 0 | 0 | -4 | -4 |
| 0 | 0 | 0 | 0 | 0 | -4 | -4 | -4 |
| 0 | 0 | 0 | 0 | -4 | -4 | -4 | -4 |
| 0 | 0 | 0 | -4 | -4 | -4 | -4 | -4 |
| 0 | 0 | -4 | -4 | -4 | -4 | -4 | -4 |

| 2 | – | – | – | – | – | – | – |
|---|---|---|---|---|---|---|---|
| – | 3/4 (4) | – | 1/4 (4) | – | 1/4 (4) | – | 1/5 (5) |
| – | – | – | – | – | – | – | – |
| – | 6/4 (4) | – | 1/4 (4) | – | 1/4 (4) | – | *3/1 (1) |
| – | – | – | – | – | – | – | – |
| – | 8/4 (4) | – | 1/4 (4) | – | * – | – | 1/1 (1) |
| – | – | – | – | – | – | – | – |
| – | 9/5 (5) | – | 6/1 (1) | – | 4/1 (1) | – | 2/1 (1) |

L2

Before converting run length/size and additional bit string

After converting run length/size and additional bit string (*:additional bit)

FIG. 21

| Run length | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Size | A | 8 | 7 | 6 | 5 | 5 | 5 | 5 | 5 | 4 | 4 | 4 | 4 | 4 | 4 | 4 |

FIG. 26

| 0 | 0 | 0 | 0 | 0 | 0 | 0 | 0 |
|---|---|---|---|---|---|---|---|
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -1 |
| 0 | 0 | 0 | 0 | -1 | -1 | -1 | -1 |
| 0 | 0 | 0 | -1 | -1 | -1 | -1 | -2 |
| 0 | 0 | -1 | -1 | -1 | -1 | -2 | -2 |
| 0 | -1 | -1 | -1 | -1 | -2 | -2 | -2 |

| -2 | – | – | – | – | – | – | – |
|---|---|---|---|---|---|---|---|
| – | 3/11 | – | 1/10 | – | 1/10 | – | 1/10 |
| – | – | – | – | – | – | – | – |
| – | 6/10 | – | 1/8 | – | 1/4 | – | 1/10 |
| – | – | – | – | – | – | – | – |
| – | 8/10 | – | 1/4 | – | 1/5 | – | 1/8 |
| – | – | – | – | – | – | – | – |
| – | 9/10 | – | 6/10 | – | 4/8 | – | 2/7 |

| Run length | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Effective coefficient (absolute value) | 512 | 128 | 64 | 32 | 16 | 16 | 16 | 16 | 16 | 8 | 8 | 8 | 8 | 8 | 8 | 8 |

| 2 | 2 | 3 | 3 | 4 | 4 | 6 | 6 |
|---|---|---|---|---|---|---|---|
| 2 | 3 | 3 | 4 | 4 | 6 | 6 | 8 |
| 3 | 3 | 4 | 4 | 6 | 6 | 8 | 16 |
| 3 | 4 | 4 | 6 | 6 | 8 | 16 | 20 |
| 4 | 4 | 6 | 6 | 8 | 16 | 20 | 20 |
| 4 | 6 | 6 | 8 | 16 | 20 | 20 | 40 |
| 6 | 6 | 8 | 16 | 20 | 20 | 40 | 80 |
| 6 | 8 | 16 | 20 | 20 | 40 | 80 | 120 |

FIG. 38A

Y component size conversion table

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |

U component size conversion table

| 0 | 0 | 0 | 0 | 0 | 0 | 0 | 0 |
|---|---|---|---|---|---|---|---|
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |
| 0 | 0 | 0 | -1 | -1 | -2 | -2 | -3 |
| 0 | 0 | -1 | -1 | -2 | -2 | -3 | -3 |
| 0 | -1 | -1 | -2 | -2 | -3 | -3 | -3 |

V component size conversion table

| 0 | 0 | 0 | 0 | 0 | 0 | 0 | 0 |
|---|---|---|---|---|---|---|---|
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |
| 0 | 0 | 0 | -1 | -1 | -2 | -2 | -3 |
| 0 | 0 | -1 | -1 | -2 | -2 | -3 | -3 |
| 0 | -1 | -1 | -2 | -2 | -3 | -3 | -3 |

L7

FIG. 41A
Y component coefficient conversion table

| 0 | 0 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |

~L8

FIG. 41B
U component coefficient conversion table

| 0 | 0 | 0 | 0 | 0 | 0 | 0 | 0 |
|---|---|---|---|---|---|---|---|
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |
| 0 | 0 | 0 | -1 | -1 | -2 | -2 | -3 |
| 0 | 0 | -1 | -1 | -2 | -2 | -3 | -3 |
| 0 | -1 | -1 | -2 | -2 | -3 | -3 | -3 |

~L9

FIG. 41C
V component coefficient conversion table

| 0 | 0 | 0 | 0 | 0 | 0 | 0 | 0 |
|---|---|---|---|---|---|---|---|
| 0 | 0 | 0 | 0 | 0 | 0 | 0 | -1 |
| 0 | 0 | 0 | 0 | 0 | 0 | -1 | -1 |
| 0 | 0 | 0 | 0 | 0 | -1 | -1 | -2 |
| 0 | 0 | 0 | 0 | -1 | -1 | -2 | -2 |
| 0 | 0 | 0 | -1 | -1 | -2 | -2 | -3 |
| 0 | 0 | -1 | -1 | -2 | -2 | -3 | -3 |
| 0 | -1 | -1 | -2 | -2 | -3 | -3 | -3 |

~L10

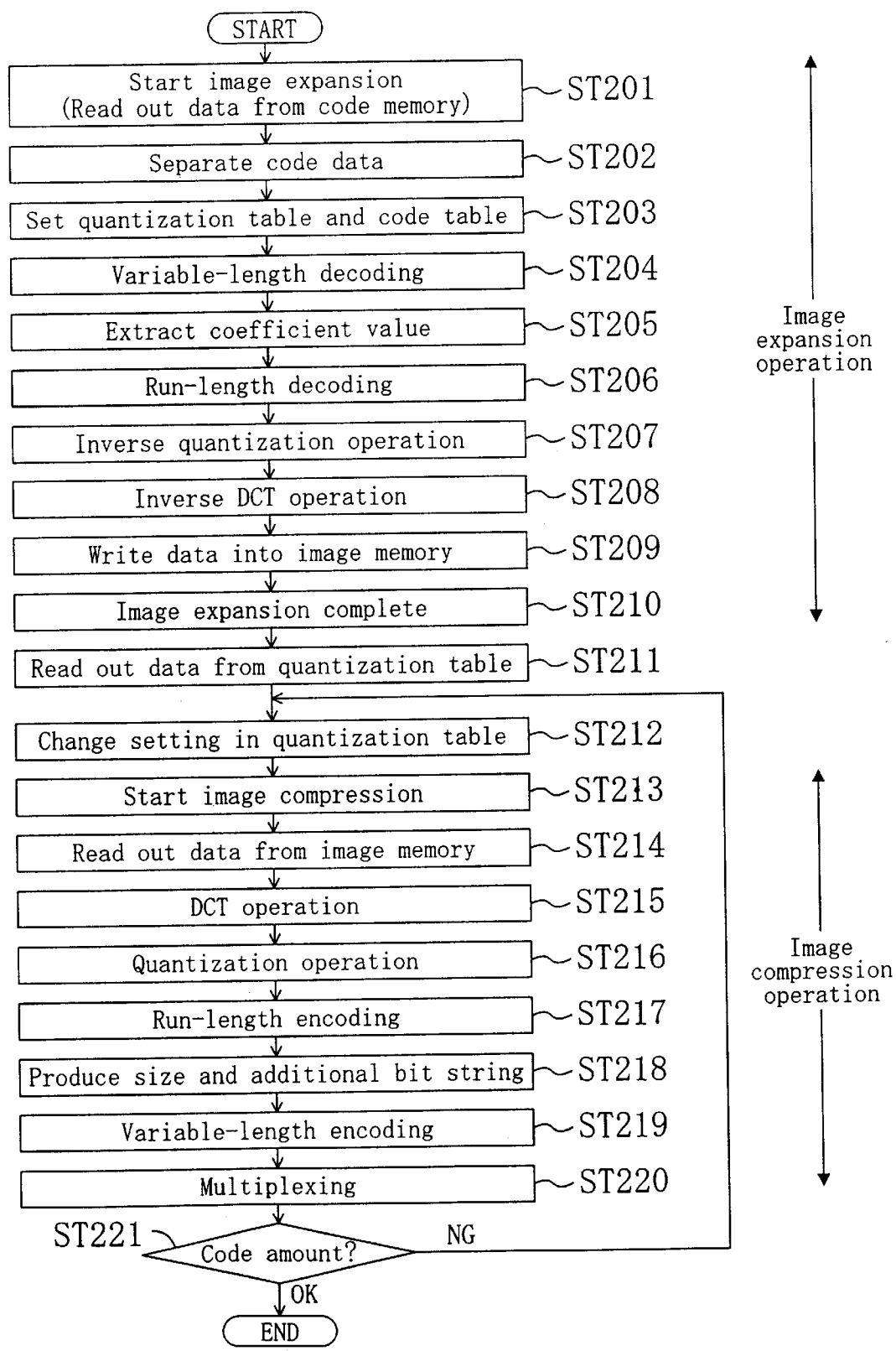

US 6,388,588 B2

ENCODING DEVICE AND ENCODING METHOD FOR CHANGING CODE AMOUNT OF COMPRESSED IMAGE DATA

BACKGROUND OF THE INVENTION

The present invention relates to an encoding device and an encoding method. More specifically, the present invention relates to an encoding device and an encoding method for changing a code amount of already compressed image data.

JPEG (Joint Photographic Experts Group) is an international image compression/expansion standard that is efficient for still images. In recent years, compressed image files compliant to the JPEG standard (hereinafter referred to as "JPEG files") have been widely used on the Internet, and the Internet users can easily download JPEG files. The Internet users can download the JPEG files and store them in a storage medium such as a hard disk or a memory.

In some cases, a user may wish to further reduce the size (code amount) of a downloaded JPEG file in view of the storage capacity of the storage medium. However, if the JPEG file has not been created by the user but has been obtained from a medium such as the Internet, the user does not have the uncompressed original image file. In such a case, it is necessary to first (1) produce recovered image data by performing an image expansion operation on the downloaded JPEG file, and then (2) compress the recovered image data at an increased compression rate.

Such an operation can be performed by using an image compression/expansion device as illustrated in FIG. 43 through a procedure as illustrated in FIG. 44.

First, compressed image data JPGDI stored in a code memory 7 is read out (ST201).

The read-out compressed image data JPGDI is separated by a separation circuit 8 into quantization step values DQT(D), code table information DHT(D) and variable-length codes CODE(D) (ST202).

The quantization step values DQT(D) are set in a quantization table 12, and the code table information DHT(D) is set in a code table 13 (ST203).

A variable-length decoding section 9c produces a run length RRRR(D)/size SSSS(D) combination from each variable-length code CODE(D), while extracting an additional bit string ADBIT(D) therefrom, based on the code table information set in the code table 13 (ST204).

A coefficient generation section 9b extracts an effective coefficient Sq(D) by using the size SSSS(D) and the additional bit string ADBIT(D) (ST205).

A run-length decoding section 9a produces a DCT coefficient ZZ(D) from the run length RRRR(D)/effective coefficient Sq(D) combination (ST206).

An inverse quantization section 10 inverse-quantizes each DCT coefficient ZZ(D) according to a corresponding quantization step value set in the quantization table 12 (ST207), and an inverse Discrete Cosine Transform (hereinafter referred to as "DCT") section 11 further performs a two-dimensional inverse DCT on the obtained data (ST208). The results of the inverse DCT are sequentially written into an image memory 2 as recovered image data PXLDO (ST209).

After the recovered image data PXLDO is obtained by performing an image expansion operation on the compressed image data as described above, the obtained data is compressed again at an increased compression rate. In order to produce compressed image data of a high compression rate, the quantization step values are read out from the quantization table 12 through an external reading terminal 21 (ST211), changed to larger values, and then re-set in the quantization table 12 (ST212).

Then, recovered image data PXLDI is read out from the image memory 2 and input to a DCT section 3 (ST214).

The DCT section 3 performs a two-dimensional DCT operation to obtain DCT coefficients (ST215).

A quantization section 4 quantizes the DCT coefficients according to the quantization step values set in the quantization table 12 in step ST212 (ST216).

The quantized DCT coefficients ZZ(E) are sequentially supplied to, and run-length-encoded in, a run-length encoding section 5a in the order of zigzag scanning, thereby obtaining run length RRRR(E)/effective coefficient Sq(E) combinations (ST217).

A size/additional bit string generation section 5b assigns a size SSSS(E) and an additional bit string ADBIT(E) to each effective coefficient Sq(E) (ST218).

A variable-length encoding section 5c assigns a variable-length code to each run length RRRR(E)/size SSSS(E) combination based on the information set in the code table 13. The additional bit string ADBIT(E) assigned by the size/additional bit string generation section 5b is attached to the end of the variable-length code, thereby producing a variable-length code CODE(E) (ST219).

The variable-length code CODE(E) is assigned to the run length RRRR(E)/size SSSS(E) combination as described above.

A multiplexing circuit 6 multiplexes together the variable-length codes CODE(E), the quantization step values DQT(E) and the code table information DHT(E) to produce new compressed image data JPGDO (ST220).

If the code amount of the obtained compressed image data JPGDO is not of a desired size, the above-described image compression operation (ST221-ST212-ST221) is repeated while changing the quantization step values. Thus, it is possible to obtain compressed image data JPGDO having a desired code amount.

As described above, when changing the code amount of a compressed image with the conventional image compression/expansion device, it is necessary to perform all of the various image expansion operations (such as variable-length decoding, run-length decoding, inverse quantization, and inverse DCT) to produce a recovered image, change the quantization step values, and then perform all of the various image compression operations (such as DCT, quantization, run-length encoding, and variable-length encoding).

SUMMARY OF THE INVENTION

An object of the present invention is to provide an encoding device capable of efficiently changing the code amount (compression rate) of compressed image data.

According to one aspect of the present invention, there is provided an encoding device for changing a code amount of compressed image data which has been produced by performing a Discrete Cosine Transform (hereinafter referred to as "DCT") operation, a quantization operation, a run-length encoding operation and a variable-length encoding operation on original image data, the encoding device including separation means, decoding means, a size conversion table, size conversion means, variable-length encoding means, and multiplexing means.

The separation means separates the compressed image data into variable-length codes, quantization step values and code table information. The code table information represents a correspondence between combinations of run length and size and code words. The decoding means decodes each of the variable-length codes from the separation means into a run length, a size and an additional bit string based on the code table information. A frequency region and a size conversion amount are set in the size conversion table. The size conversion means performs a conversion operation on the run length, the size and the additional bit string obtained by the decoding means based on the frequency region and the size conversion amount set in the size conversion table. The variable-length encoding means performs a variable-length encoding operation on the run length, the size and the additional bit string converted by the size conversion means based on the code table information. The multiplexing means multiplexes together variable-length codes obtained by the variable-length encoding means, the quantization step values and the code table information.

In the encoding device, the size conversion means changes the value of each size belonging to the frequency region set in the size conversion table among the sizes obtained by the decoding means by the size conversion amount set for the frequency region. Moreover, the size conversion means also changes the additional bit string and the run length according to the change in the size. Therefore, the code amount of a variable-length code obtained by the variable-length encoding means is different from the code amount of the variable-length code from the separation means. Thus, the code amount of the compressed image data which is obtained as a result of the multiplexing operation by the multiplexing means is different from the code amount of the compressed image data before being separated by the separation means.

As described above, the encoding device is provided with the size conversion table and the size conversion means, thereby eliminating the need to perform the operations required for recovering the original image (such as inverse quantization and inverse DCT) and the operations required for compressing the image (such as updating the quantization table, DCT, quantization, run-length encoding). Thus, it is possible to efficiently change the code amount of compressed image data.

Preferably, the encoding device further includes specification means. The specification means specifies a combination of run length and size to be converted. The size conversion means performs the conversion operation when the run length and the size obtained by the decoding means match the combination specified by the specification means.

There are some cases where the code length of a code word corresponding to a run length/size combination remains unchanged even if the size is changed for a particular frequency region by the size conversion means. In such a case, a significant effect of changing the code amount is not obtained. The quantization step values are multiplexed by the multiplexing means with the variable-length codes obtained by the variable-length encoding means and the code table information while only the quantization step values are left unchanged. Therefore, the image quality may deteriorate when an image recovery operation is performed on the compressed image data obtained by the multiplexing means. Thus, in some cases, the deterioration in the image quality may be significant while there is only a little effect of reducing the code amount.

In the encoding device, the specification means specifies, as a combination to be converted, a combination of run length and size for which a code amount changing effect can be obtained. The size conversion means performs the conversion operation when the run length and the size obtained by the decoding means match the combination specified by the specification means. Therefore, it is possible to suppress the deterioration in the image quality which may occur when an image recovery operation is performed on the compressed image data.

Preferably, the encoding device further includes changing means. The changing means changes the quantization step values based on the frequency region and the size conversion amount set in the size conversion table. The multiplexing means multiplexes together the quantization step values changed by the changing means, the variable-length codes obtained by the variable-length encoding means and the code table information.

As described above, when the quantization step values are multiplexed by the multiplexing means while they are left unchanged, the deterioration in the image quality may occur when an image recovery operation is performed on the obtained compressed image data.

In the encoding device, the changing means is provided, whereby the quantization step values are changed based on the frequency region and the size conversion amount set in the size conversion table. Then, the changed quantization step values are multiplexed by the multiplexing means. Therefore, it is possible to suppress the deterioration in the image quality which may occur when an image recovery operation is performed on the obtained compressed image data.

Preferably, the size conversion table includes a luminance component conversion table and a color difference component conversion table. A first frequency region and a first size conversion amount are set in the luminance component conversion table. A second frequency region and a second size conversion amount are set in the color difference component conversion table. The size conversion means converts each combination of run length, size and additional bit string for a luminance component among the run lengths, the sizes and the additional bit strings obtained by the decoding means based on the first frequency region and the first size conversion amount, and converts each combination of run length, size and additional bit string for a color difference component among the run lengths, the sizes and the additional bit strings obtained by the decoding means based on the second frequency region and the second size conversion amount.

Generally, human eyes are very sensitive to changes in the luminance component, but are relatively insensitive to changes in the color difference components.

In the encoding device, the size conversion table includes the luminance component conversion table and the color difference component conversion table. A small frequency region (the first frequency region) for which a conversion is to be performed and a small size conversion amount (the first size conversion amount) are set in the luminance component conversion table, and a large frequency region (the second frequency region) for which a conversion is to be performed and a large size conversion amount (the second size conversion amount) are set in the color difference component conversion table. In this way, it is possible to reduce the code amount in such a manner that the deterioration in the image quality due to the conversion is less perceivable by human eyes.

Preferably, the encoding device further includes a size memory. The size memory stores the run length, the size and the additional bit string obtained by the decoding means. The size conversion means converts the run length, the size and the additional bit string which are read out from the size memory based on the frequency region and the size conversion amount set in the size conversion table.

The run-lengths, the sizes and the additional bit strings are generated from the decoding means at irregular rates. However, the encoding device is provided with the size memory, whereby the run lengths, the sizes and the additional bit strings obtained by the decoding means can be continuously supplied to the size conversion means at a constant rate. Thus, it is possible to continuously perform the conversion operation by the size conversion means.

Preferably, the encoding device further includes a code memory and memory control means. The code memory stores compressed image data. The memory control means controls writing/reading of data to/from the size memory and the code memory. Specifically, the memory control means sets the code memory in a read mode and the size memory in a write mode when the size memory runs out of the run length, the size and the additional bit string to be read out there from, whereas the memory control means sets the size memory in the read mode and the code memory in the write mode when the size memory runs out of a space for writing the run length, the size and the additional bit string.

In the encoding device, the memory control means first controls the code memory in the read mode and the size memory in the write mode. Thus, compressed image data is read out from the code memory, and is subjected to the operation by the separation means and the operation by the decoding means. Then, the run lengths, the sizes and the additional bit strings obtained by the decoding means are written into the size memory.

Then, when the size memory runs out of a space for writing the run length, the size and the additional bit string, the memory control means controls the size memory in the read mode and the code memory in the write mode. Thus, the operation of reading out compressed image data from the code memory is stopped. The run lengths, the sizes and the additional bit strings which have been written into the size memory are read out from the size memory, and are subjected to the operation by the size conversion means, the operation by the variable-length encoding means and the operation by the multiplexing means. The results of the multiplexing operation are written into the code memory.

Then, when the size memory runs out of the run length, the size and the additional bit string to be read out therefrom, the memory control means controls the code memory in the read mode and the size memory in the write mode. Thus, the operation of reading out compressed image data from the code memory is resumed.

In this way, the series of decoding operations, including reading out compressed image data from the code memory, the operation by the separation means and the operation by the decoding means, and the series of encoding operations, including the operation by the size conversion means, the operation by the variable-length encoding means and the operation by the multiplexing means, can be alternately performed in a time division manner. Thus, it is not necessary to store all of the run lengths, sizes and additional bit strings for the entire compressed image data in the size memory. As a result, it is possible to reduce the capacity of the size memory.

According to another aspect of the present invention, there is provided an encoding device for changing a code amount of compressed image data which has been produced by performing a DCT operation, a quantization operation, a run-length encoding operation and a variable-length encoding operation on original image data, the encoding device including separation means, decoding means, coefficient generation means, a coefficient conversion table, coefficient conversion means, size/additional bit string generation means, variable-length encoding means and multiplexing means.

The separation means separates the compressed image data into variable-length codes, quantization step values and code table information. The code table information represents a correspondence between combinations of run length and size and code words. The decoding means decodes each of the variable-length codes from the separation means into a run length, a size and an additional bit string based on the code table information. The coefficient generation means specifies an effective coefficient based on the size and the additional bit string obtained by the decoding means. A frequency region and a coefficient conversion amount are set in the coefficient conversion table. The coefficient conversion means performs a conversion operation on the run length obtained by the decoding means and the effective coefficient specified by the coefficient generation means based on the frequency region and the coefficient conversion amount set in the coefficient conversion table. The size/additional bit string generation means assigns a size and an additional bit string to the effective coefficient converted by the coefficient conversion means. The variable-length encoding means performs a variable-length encoding operation on the run length converted by the coefficient conversion means and the size and the additional bit string assigned by the size/additional bit string generation means based on the code table information. The multiplexing means multiplexes together variable-length codes obtained by the variable-length encoding means, the quantization step values and the code table information.

In the encoding device, the coefficient conversion means changes the value of each effective coefficient belonging to the frequency region set in the coefficient conversion table among the effective coefficients obtained by the coefficient generation means by the coefficient conversion amount set for the frequency region. Moreover, the coefficient conversion means also changes the run length according to the change in the effective coefficient. Therefore, the size and the additional bit string assigned by the size/additional bit string generation means are different from the size and the additional bit string obtained by the decoding means. Moreover, the code amount of a variable-length code obtained by the variable-length encoding means is different from the code amount of the variable-length code from the separation means. As a result, the code amount of the compressed image data which is obtained as a result of the multiplexing operation by the multiplexing means is different from the code amount of the compressed image data before being separated by the separation means.

As described above, the encoding device is provided with the coefficient conversion table and the coefficient conversion means, thereby eliminating the need to perform the operations required for recovering the original image (such as inverse quantization and inverse DCT) and the operations required for compressing the image (such as updating the quantization table, DCT, quantization, run-length encoding). Thus, it is possible to efficiently change the code amount of compressed image data.

Preferably, the encoding device further includes specification means. The specification means specifies a combination of run length and effective coefficient to be converted. The coefficient conversion means performs the conversion operation when the run length obtained by the decoding means and the effective coefficient specified by the coefficient generation means match the combination specified by the specification means.

There are some cases where the code length of a code word corresponding to a run length/size combination remains unchanged even if the value of an effective coefficient in a particular frequency region is changed by the coefficient conversion means. In such a case, a significant effect of changing the code amount is not obtained. The quantization step values are multiplexed by the multiplexing means with the variable-length codes obtained by the variable-length encoding means and the code table information while only the quantization step values are left unchanged. Therefore, the image quality may deteriorate when an image recovery operation is performed on the compressed image data which is obtained as a result of the multiplexing operation by the multiplexing means. Thus, in some cases, the deterioration in the image quality may be significant while there is only a little effect of changing the code amount.

In the encoding device, the specification means specifies, as a combination to be converted, a combination of run length and effective coefficient for which a code amount changing effect can be obtained. Moreover, the coefficient conversion means performs the conversion operation when the run length obtained by the decoding means and the effective coefficient specified by the coefficient generation means match the combination specified by the specification means. Therefore, it is possible to suppress the deterioration in the image quality which may occur when an image recovery operation is performed on compressed image data.

Preferably, the encoding device further includes changing means. The changing means changes the quantization step values based on the frequency region and the coefficient conversion amount set in the coefficient conversion table. The multiplexing means multiplexes together the quantization step values changed by the changing means, the variable-length codes obtained by the variable-length encoding means and the code table information.

As described above, in a case where the multiplexing operation is performed by the multiplexing means while the quantization step values are left unchanged, deterioration in the image quality may occur when an image recovery operation is performed on the obtained compressed image data.

The encoding device is provided with the changing means, whereby the quantization step values are changed based on the frequency region and the coefficient conversion amount set in the coefficient conversion table. Then, the changed quantization step values are multiplexed by the multiplexing means. Therefore, it is possible to suppress the deterioration in the image quality which may occur when an image recovery operation is performed on the obtained compressed image data.

Preferably, the coefficient conversion table includes a luminance component conversion table and a color difference component conversion table. A first frequency region and a first coefficient conversion amount are set in the luminance component conversion table. A second frequency region and a second coefficient conversion amount are set in the color difference component conversion table. The coefficient conversion means converts each combination of run length and effective coefficient for a luminance component among the run lengths obtained by the decoding means and the effective coefficients specified by the coefficient generation means based on the first frequency region and the first coefficient conversion amount, and converts each combination of run length and effective coefficient for a color difference component among the run lengths obtained by the decoding means and the effective coefficients specified by the coefficient generation means based on the second frequency region and the second coefficient conversion amount.

Generally, human eyes are very sensitive to changes in the luminance component, but are relatively insensitive to changes in the color difference components.

In the encoding device, the coefficient conversion table includes the luminance component conversion table and the color difference component conversion table. A small frequency region (the first frequency region) for which a conversion is to be performed and a small coefficient conversion amount (the first coefficient conversion amount) are set in the luminance component conversion table, and a large frequency region (the second frequency region) for which a conversion is to be performed and a large coefficient conversion amount (the second coefficient conversion amount) are set in the color difference component conversion table. In this way, it is possible to reduce the code amount in such a manner that the deterioration in the image quality due to the conversion is less perceivable by human eyes.

Preferably, the encoding device further includes a coefficient memory. The coefficient memory stores the run length obtained by the decoding means and the effective coefficient specified by the coefficient generation means. The coefficient conversion means converts the run length and the effective coefficient which are read out from the coefficient memory based on the frequency region and the coefficient conversion amount set in the coefficient conversion table.

The run-lengths from the decoding means and the effective coefficients from the coefficient generation means are generated at irregular rates. However, the encoding device is provided with the coefficient memory, whereby the run lengths obtained by the decoding means and the effective coefficients from the coefficient generation means can be continuously supplied to the coefficient conversion means at a constant rate. Thus, it is possible to continuously perform the conversion operation by the coefficient conversion means.

Preferably, the encoding device further includes a code memory and memory control means. The code memory stores compressed image data. The memory control means controls writing/reading of data to/from the coefficient memory and the code memory. Specifically, the memory control means set the code memory in a read mode and the coefficient memory in a write mode when the coefficient memory runs out of the run length and the effective coefficient to be read out therefrom, whereas the memory control means sets the coefficient memory in the read mode and the code memory in the write mode when the coefficient memory runs out of a space for writing the run length and the effective coefficient.

In the encoding device, the memory control means first controls the code memory in the read mode and the coefficient memory in the write mode. Thus, compressed image data is read out from the code memory, and is subjected to the operation by the separation means, the operation by the decoding means and the operation by the coefficient generation means. Then, the run lengths obtained by the decoding means and the effective coefficients obtained by the coefficient generation means are written into the coefficient memory.

Then, when the coefficient memory runs out of a space for writing the run length and the effective coefficient, the memory control means controls the coefficient memory in the read mode and the code memory in the write mode. Thus, the operation of reading out compressed image data from the code memory is stopped. The run lengths and the effective coefficients which have been written into the coefficient memory are read out from the coefficient memory, and are subjected to the operation by the coefficient conversion means, the operation by the size/additional bit string generation means, the operation by the variable-length encoding means and the operation by the multiplexing means. The results of the operation by the multiplexing means are written into the code memory.

Then, when the coefficient memory runs out of the run length and the effective coefficient to be read out therefrom, the memory control means controls the code memory in the read mode and the coefficient memory in the write mode. Thus, the operation of reading out compressed image data from the code memory is resumed.

In this way, the series of decoding operations, including reading out compressed image data from the code memory, the operation by the separation means, the operation by the decoding means and the operation by the coefficient generation means, and the series of encoding operations, including the operation by the coefficient conversion means, the operation by the size/additional bit string generation means, the operation by the variable-length encoding means and the operation by the multiplexing means, can be alternately performed in a time division manner. Thus, it is not necessary to store all of the run lengths and the effective coefficients for the entire compressed image data in the coefficient memory. As a result, it is possible to reduce the capacity of the coefficient memory.

According to still another aspect of the present invention, there is provided an encoding method for changing a code amount of compressed image data which has been produced by performing a DCT operation, a quantization operation, a run-length encoding operation and a variable-length encoding operation on original image data, the encoding method including a separation step, a decoding step, a setting step, a conversion step, a variable-length encoding step and a multiplexing step.

In the separation step, the compressed image data is separated into variable-length codes, quantization step values and code table information. The code table information represents a correspondence between combinations of run length and size and code words. In the decoding step, each of the variable-length codes is decoded into a run length, a size and an additional bit string based on the code table information. In the setting step, a frequency region and a size conversion amount are set. In the conversion step, a conversion operation is performed on the run length, the size and the additional bit string obtained in the decoding step based on the frequency region and the size conversion amount which have been set. In the variable-length encoding step, a variable-length encoding operation is performed on the run length, the size and the additional bit string converted in the conversion step based on the code table information. In the multiplexing step, variable-length codes obtained in the variable-length encoding step, the quantization step values and the code table information are multiplexed together.

Moreover, in the encoding method, if a code amount of compressed image data obtained in the multiplexing step is not a desired value, the frequency region and/or the size conversion amount set in the setting step are/is changed, and the conversion step, the variable-length encoding step and the multiplexing step are performed again.

In the encoding method, the value of each size belonging to the frequency region which has been set among the sizes obtained in the decoding step is changed in the conversion step by the size conversion amount set for the frequency region. Moreover, the additional bit string and the run length are also changed according to the change in the size. Therefore, the code amount of a variable-length code obtained in the variable-length encoding step is different from the code amount of the variable-length code obtained in the separation step. Thus, the code amount of the compressed image data which is obtained as a result of the multiplexing operation in the multiplexing step is different from the code amount of the compressed image data before being separated in the separation step.

Then, if the code amount of the compressed image data obtained in the multiplexing step is not a desired value, the frequency region and/or the size conversion amount set in the setting step are/is changed.

For example, when the code amount of the produced compressed image data is greater than the desired value, the size of the frequency region is increased, whereas when it is less than the desired value, the size of the frequency region is reduced. Similarly for the size conversion amount, when the code amount is greater than the desired value, the size conversion amount is increased, whereas when the code amount is less than the desired value, the size conversion amount is reduced. The setting can be changed by increasing or reducing either or both of the size of the frequency region and the size conversion amount.

After changing the setting, the conversion step, the variable-length encoding step and the multiplexing step are performed again.

As described above, in the encoding method, the conversion step, the variable-length encoding step and the multiplexing step are repeated while changing the frequency region and/or the size conversion amount until the code amount of the produced compressed image data is a desired value. Thus, it is possible to obtain compressed image data having a desired code amount.

According to still another aspect of the present invention, there is provided an encoding method for changing a code amount of compressed image data which has been produced by performing a DCT operation, a quantization operation, a run-length encoding operation and a variable-length encoding operation on original image data, the encoding method including: a separation step, a decoding step, a specification step, a setting step, a conversion step, an assignment step, a variable-length encoding step and a multiplexing step.

In the separation step, the compressed image data is separated into variable-length codes, quantization step values and code table information. The code table information represents a correspondence between combinations of run length and size and code words. In the decoding step, each of the variable-length codes is decoded into a run length, a size and an additional bit string based on the code table information. In the specification step, an effective coefficient is specified based on the size and the additional bit string obtained in the decoding step. In the setting step, a frequency region and a coefficient conversion amount are set. In the conversion step, the run length obtained in the decoding step and the effective coefficient specified by the specification step are converted based on the frequency region and the coefficient conversion amount which have been set. In the assignment step, a size and an additional bit string are assigned to the effective coefficient converted in the conversion step. In the variable-length encoding step, a variable-length encoding operation is performed on the run length converted in the conversion step and the size and the additional bit string assigned in the assignment step based on the code table information. In the multiplexing step, variable-length codes obtained in the variable-length encoding step, the quantization step values and the code table information are multiplexed together.

Moreover, in the encoding method, if a code amount of compressed image data obtained in the multiplexing step is not a desired value, the frequency region and/or the coefficient conversion amount set in the setting step are/is changed, and the conversion step, the assignment step, the variable-length encoding step and the multiplexing step are performed again.

In the encoding method, the value of each effective coefficient belonging to the frequency region which has been set among the effective coefficients obtained in the specification step is changed in the conversion step by the coefficient conversion amount set for the frequency region. Moreover, the run length is also changed according to the change in the effective coefficient. Therefore, the size and the additional bit string assigned in the assignment step are different from the size and the additional bit string obtained in the decoding step. Moreover, the code amount of a variable-length code obtained in the variable-length encoding step is different from the code amount of the variable-length code obtained in the separation step. As a result, the code amount of the compressed image data which is obtained as a result of the multiplexing operation in the multiplexing step is different from the code amount of the compressed image data before being separated in the separation step.

Then, if the code amount of the compressed image data obtained in the multiplexing step is not a desired value, the frequency region and/or the coefficient conversion amount set in the setting step are/is changed.

For example, when the code amount of the newly produced compressed image data is greater than the desired value, the size of the frequency region is increased, whereas when it is less than the desired value, the size of the frequency region is reduced. Similarly for the coefficient conversion amount, when the code amount is greater than the desired value, the coefficient conversion amount is increased, whereas when the code amount is less than the desired value, the coefficient conversion amount is reduced. The setting can be changed by increasing or reducing either or both of the size of the frequency region and the coefficient conversion amount.

After changing the setting, the conversion step, the assignment step, the variable-length encoding step and the multiplexing step are performed again.

As described above, in the encoding method, the conversion step, the assignment step, the variable-length encoding step and the multiplexing step are repeated while changing the frequency region and/or the coefficient conversion amount until the code amount of the produced compressed image data is a desired value. Thus, it is possible to obtain compressed image data having a desired code amount.

BRIEF DESCRIPTION OF THE DRAWINGS

FIG. 4 is a diagram illustrating an exemplary set of quantization step values which is set in a quantization table illustrated in FIG. 1.

FIG. 5 is a diagram illustrating exemplary information representing the correspondence between run length/size combinations and code words which is set in a code table illustrated in FIG. 1.

FIG. 6 is a diagram illustrating an exemplary 8×8-pixel block of image data which is read out from an image memory illustrated in FIG. 1.

FIG. 7 is a diagram illustrating an exemplary set of DCT coefficients which is obtained as a result of a two-dimensional DCT by a DCT section illustrated in FIG. 1.

FIG. 8 is a diagram illustrating an exemplary set of DCT coefficients which has been quantized by a quantization section illustrated in FIG. 1.

FIG. 11 is a diagram illustrating a relationship among the effective coefficient, the size and the additional bit string (the number of additional bits).

FIG. 12 is a diagram illustrating the result of an exemplary assignment of a size and an additional bit string to each effective coefficient.

FIG. 14 is a diagram illustrating an exemplary configuration and setting of a size conversion table illustrated in FIG. 2.

FIG. 15 is a diagram illustrating run length/size combinations after size conversion.

FIG. 16 is a diagram illustrating another exemplary configuration and setting of a size conversion table illustrated in FIG. 2.

FIG. 17 is a diagram illustrating run length/size combinations after size conversion.

FIG. 21 is a diagram illustrating an exemplary set of run lengths and sizes which is set in a run length/size monitoring section.

FIG. 26 is a diagram illustrating an exemplary configuration and setting of a coefficient conversion table illustrated in FIG. 23.

FIG. 27 is a diagram illustrating run length/effective coefficient combinations after coefficient conversion.

FIG. 30 is a diagram illustrating an exemplary set of run lengths and effective coefficients which is set in a run length/coefficient monitoring section.

FIG. 38A, FIG. 38B and FIG. 38C are diagrams respectively illustrating exemplary settings of Y, U and V component size conversion tables illustrated in FIG. 37.

FIG. 41A, FIG. 41B and FIG. 41C are diagrams respectively illustrating exemplary settings of Y, U and V component coefficient conversion tables illustrated in FIG. 40.

FIG. 44 is a flow chart illustrating a procedure of a code amount changing operation by the image compression/expansion device illustrated in FIG. 43.

DETAILED DESCRIPTION OF PREFERRED EMBODIMENTS OF THE INVENTION

Figure 1:
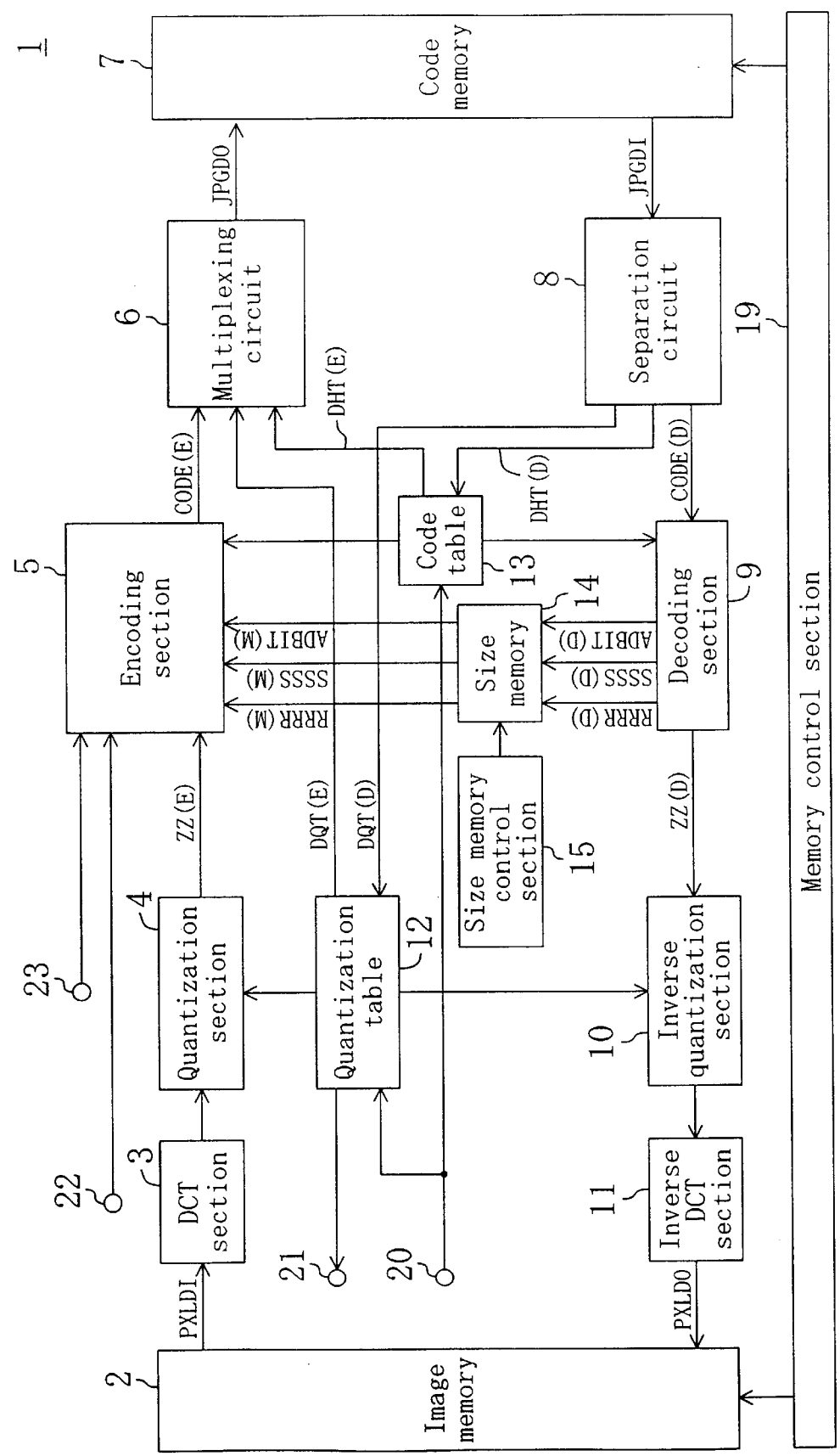
FIG. 1 is a block diagram illustrating an overall configuration of an image compression/expansion device according to the first embodiment of the present invention.

Various embodiments of the present invention will now be described in detail with reference to the figures. Like reference numerals denote like elements throughout the figures, and the same element will not be described repeatedly.

First Embodiment

FIG. 1 is a block diagram illustrating an overall configuration of an image compression/expansion device 1 according to the first embodiment of the present invention.

Referring to FIG. 1, the image compression/expansion device 1 includes an image memory 2, a Discrete Cosine Transform (hereinafter referred to as "DCT") section 3, a quantization section 4, an encoding section 5, a multiplexing circuit 6, a code memory 7, a separation circuit 8, a decoding section 9, an inverse quantization section 10, an inverse DCT section 11, a quantization table 12, a code table 13, a size memory 14, a size memory control section 15, a memory control section 19, a writing terminal 20, a reading terminal 21, a switching terminal 22 and a setting terminal 23.

The image compression/expansion device 1 performs the operation of compressing image data stored in the image memory 2 to produce compressed image data, the operation of expanding compressed image data stored in the code memory 7 to produce recovered image data, and the operation of changing the code amount of the compressed image data stored in the code memory 7.

The image memory 2 stores image data. The code memory 7 stores compressed image data. The memory control section 19 controls writing/reading of data into/from the image memory 2 and the code memory 7.

The DCT section 3 performs a two-dimensional DCT operation on image data PXLDI read out from the image memory 2. The image data PXLDI is read out by blocks of 8×8 pixels. The quantization table 12 stores respective quantization step values for DCT coefficients. The quantization section 4 performs a linear quantization operation on DCT coefficients obtained by the DCT section 3 based on the quantization step values stored in the quantization table 12. The code table 13 stores code table information representing the correspondence between the run length/size combinations and code words. The encoding section 5 produces variable-length codes CODE(E) by performing a variable-length encoding operation on the DCT coefficients ZZ(E) obtained by the quantization section 4, or on run lengths RRRR(M), sizes SSSS(M) and additional bit strings ADBIT(M) from the size memory 14. The multiplexing circuit 6 produces compressed image data JPGDO by multiplexing together quantization step values DQT(E) stored in the quantization table 12, code table information DHT(E) stored in the code table 13 and the variable-length codes CODE(E) obtained by the encoding section 5.

The separation circuit 8 separates compressed image data JPGDI read out from the code memory 7 into quantization step values DQT(D), code table information DHT(D) representing the correspondence between run length/size combinations and code words, and variable-length codes CODE(D). The quantization step values DQT(D) are set in the quantization table 12. The code table information DHT(D) is set in the code table 13. The decoding section 9 performs a variable-length decoding operation on the variable-length codes CODE(D) based on the information set in the code table 13 to obtain run length RRRR(D)/size SSSS(D) combinations and additional bit strings ADBIT(D). Moreover, the decoding section 9 performs a run-length decoding operation on the obtained run length RRRR(D)/size SSSS (D) combinations and the additional bit strings ADBIT(D) to obtain DCT coefficients ZZ(D). The size memory 14 temporarily stores the run lengths RRRR(D), the sizes SSSS(D) and the additional bit strings ADBIT(D) from the decoding section 9. The size memory control section 15 controls writing/reading of data into/from the size memory 14. The inverse quantization section 10 performs a linear inverse quantization operation on the DCT coefficients ZZ(D) based on the quantization step values set in the quantization table 12. The inverse DCT section 11 performs a two-dimensional inverse DCT operation on the DCT coefficients from the inverse quantization section 10.

The writing terminal 20 is a terminal used for setting values in the quantization table 12 and the code table 13. The reading terminal 21 is a terminal used for reading out quantization step values from the quantization table 12. The switching terminal 22 is a terminal used for controlling a size selector (not shown) provided in the encoding section 5. The setting terminal 23 is a terminal for setting a frequency region and a size conversion amount in a size conversion table (not shown) provided in the encoding section 5.

Figure 2:
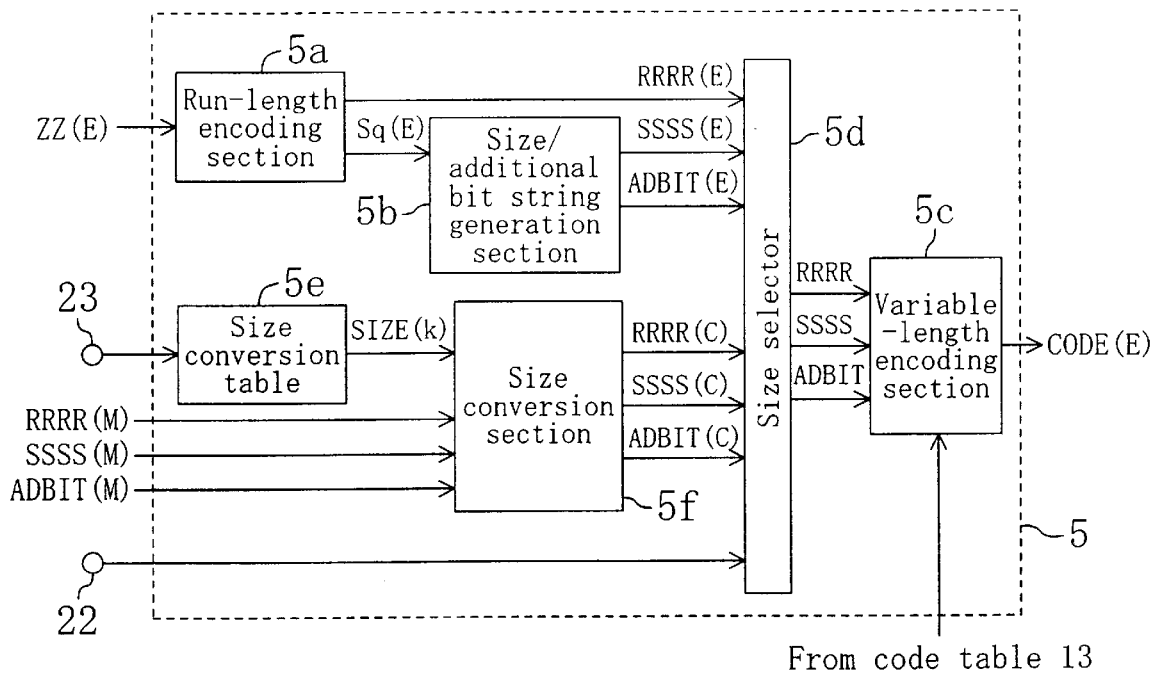
FIG. 2 is a block diagram illustrating an internal configuration of an encoding section illustrated in FIG. 1.

FIG. 2 is a block diagram illustrating an internal configuration of the encoding section 5 illustrated in FIG. 1. Referring to FIG. 2, the encoding section 5 includes a run-length encoding section 5a, a size/additional bit string generation section 5b, a variable-length encoding section 5c, a size selector 5d, a size conversion table 5e, and a size conversion section 5f.

The run-length encoding section 5a receives the DCT coefficients ZZ(E) from the quantization section 4 (FIG. 1), and produces combinations of run length RRRR(E) and effective coefficient Sq(E). In each combination, the run length RRRR(E) represents the number of consecutive zeros, and the effective coefficient Sq(E) represents a non-zero effective coefficient following the consecutive zeros. The size/additional bit string generation section 5b assigns a size SSSS(E) and an additional bit string ADBIT(E) to each effective coefficient Sq(E). The frequency region and the size conversion amount are set in the size conversion table 5e via the setting terminal 23. The size conversion section 5f converts the run length RRRR(M), the size SSSS(M) and the additional bit string ADBIT(M) which are read out from the size memory 14 (FIG. 1) based on the frequency region and the size conversion amount SIZE(k) set in the size conversion table 5e. The size selector 5d selectively outputs either the combination of run length RRRR(E), size SSSS(E) and additional bit string ADBIT(E) from the run-length encoding section 5a and the size/additional bit string generation section 5b or the combination of run length RRRR(C), size SSSS(C) and additional bit string ADBIT(C) from the size conversion section 5f. The variable-length encoding section 5c assigns a code word to each run length RRRR/size SSSS combination from the size selector 5d based on the code table information set in the code table 13 (FIG. 1), and attaches an additional bit string ADBIT from the size selector 5d to the end of the assigned code word, thereby producing the variable-length code CODE(E).

Figure 3:
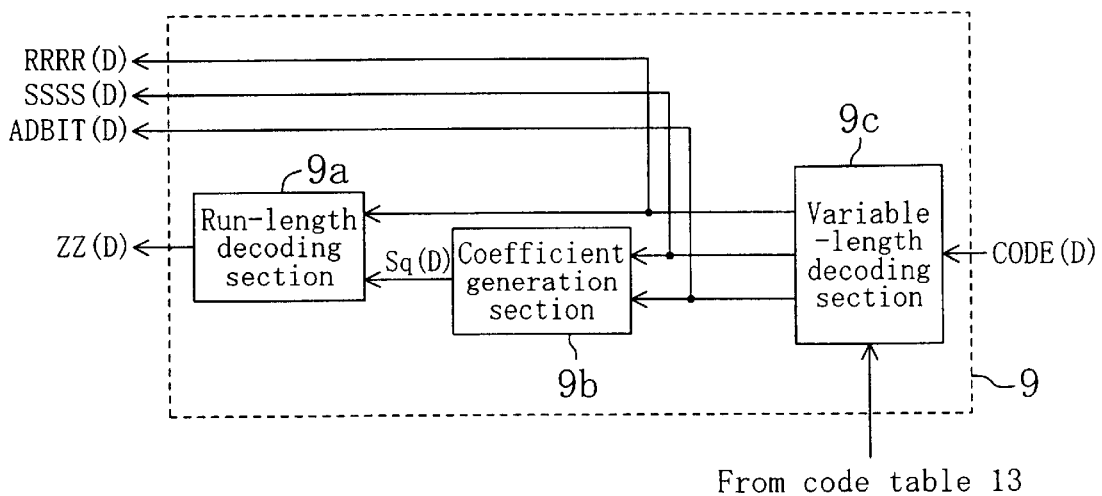
FIG. 3 is a block diagram illustrating an internal configuration of a decoding section illustrated in FIG. 1.

FIG. 3 is a block diagram illustrating an internal configuration of the decoding section 9 illustrated in FIG. 1. Referring to FIG. 3, the decoding section 9 includes a run-length decoding section 9a, a coefficient generation section 9b and a variable-length decoding section 9c.

The variable-length decoding section 9c decodes the variable-length codes CODE(D) from the separation circuit 8 (FIG. 1) into the run lengths RRRR(D), the sizes SSSS(D) and the additional bit strings ADBIT(D) based on the code table information set in the code table 13 (FIG. 1). The coefficient generation section 9b produces an effective coefficient Sq(D) from each combination of size SSSS(D) and additional bit string ADBIT(D). The run-length decoding section 9a produces DCT coefficients ZZ(D) based on the run lengths RRRR(D) from the variable-length decoding section 9c and the effective coefficients Sq(D) from the coefficient generation section 9b.

Next, the operation of the image compression/expansion device 1 having such a configuration will be described.

Image Compression Operation

First, quantization step values as illustrated in FIG. 4 are set in the quantization table 12 (FIG. 1), and the code table information representing the correspondence between run length/size combinations and code words as illustrated in FIG. 5 is set in the code table 13 (FIG. 1). Moreover, setting of other values that are required for a common compression operation, such as the image size and the sampling factor, is performed.

After completion of the various compression settings, the image data PXLDI is read out from the image memory 2 (FIG. 1) by blocks of 8×8 pixels as illustrated in FIG. 6.

The image data PXLDI is input to the DCT section 3 (FIG. 1), and is subjected to a two-dimensional DCT by the DCT section 3. As a result, DCT coefficients as illustrated in FIG. 7 are obtained. Among the DCT coefficients illustrated in FIG. 7, one in the upper left corner is called a "DC coefficient" representing the average value in the 8×8-pixel block. The other coefficients are called "AC coefficients", and there are 63 AC coefficients (AC1–AC63) in each block.

The DCT coefficients are linearly quantized by the quantization section 4 (FIG. 1) according to the quantization step values illustrated in FIG. 4. The quantized DCT coefficients ZZ(E) are as illustrated in FIG. 8.

Figures 9, 10:
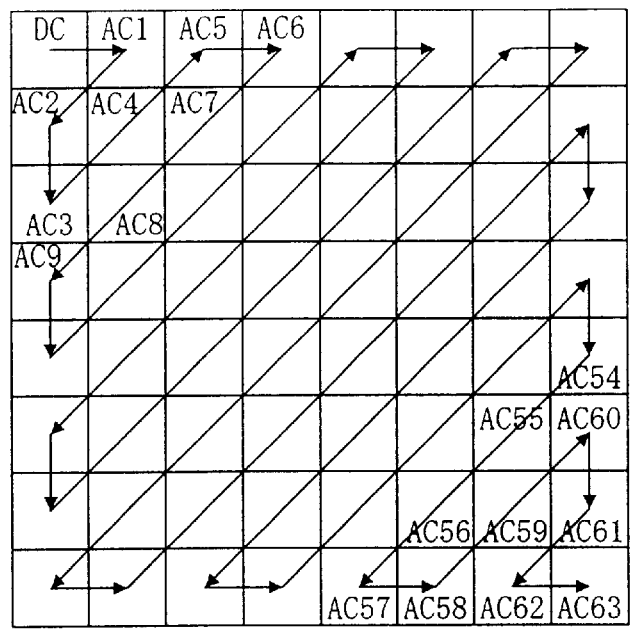
FIG. 9 is a diagram illustrating the order of zigzag scanning
FIG. 10 is a diagram illustrating an exemplary set of run length/effective coefficient combinations which is obtained as a result of a zigzag scanning process.

The quantized DCT coefficients are sequentially supplied to the run-length encoding section 5a (FIG. 2) in the order of zigzag scanning as illustrated in FIG. 9. Then, the quantized DCT coefficients are encoded by the run-length encoding section 5a into combinations of run length RRRR (E) and effective coefficient Sq(E). In each combination, the run length RRRR(E) represents the number of consecutive zeros, and the effective coefficient Sq(E) represents a non-zero effective coefficient following the consecutive zeros.

In the case of FIG. 8, the quantized DCT coefficients ZZ(E) are supplied to the run-length encoding section 5a in the order of zigzag scanning: −2, 0, 0, 0, 11, 0, 0, 0, . . . As a result, run length RRRR(E)/effective coefficient Sq(E) combinations as illustrated in FIG. 10 are obtained. Note that in FIG. 10, each figure on the left of the symbol "/" denotes a run length RRRR(E), and each figure on the right of the symbol "/" denotes an effective coefficient Sq(E).

The effective coefficients Sq(E) are input to the size/ additional bit string generation section 5b (FIG. 2), and are each assigned a size SSSS(E) and an additional bit string ADBIT(E). FIG. 11 illustrates the relationship among the effective coefficient Sq, the size SSSS and the number of additional bits. The effective coefficients Sq are grouped into a number of size groups as illustrated in FIG. 11. The column "size SSSS" shows various size groups to which different values of effective coefficient Sq belong. Moreover, each effective coefficient Sq is assigned the same number of additional bits as the size value to which the effective coefficient Sq belongs so as to specify one of the various effective coefficients that belong to the size group.

For example, among the quantized DCT coefficients illustrated in FIG. 8, the effective coefficient value of the 24$^{th}$ AC coefficient (AC24) is +8. As illustrated in FIG. 11, the effective coefficient +8 belongs to the size group "4". Therefore, the size SSSS(E)=4 is assigned. Moreover, since there are 16 effective coefficients in the size group "4", 4 additional bits are required to specify the effective coefficient among the 16 effective coefficients in the same size group. Additional bit values '0000', '0001', . . . , are assigned in this order to the effective coefficients in the same size group illustrated in FIG. 11, starting from the smallest effective coefficient. The effective coefficient +8 is the ninth smallest coefficient in the size group "4". Therefore, the additional bit string ADBIT(E)='1000' is assigned.

In this way, the effective coefficients illustrated in FIG. 10 are sequentially assigned a size and an additional bit string. As a result, run length RRRR(E)/size SSSS(E) combinations as illustrated in FIG. 12 are obtained. Note that in FIG. 12, each figure in parentheses denotes the number of additional bits. Then, the run lengths RRRR(E), the sizes SSSS(E) and the additional bit strings ADBIT(E) are input to the size selector 5d (FIG. 2).

Upon receipt of a control signal from the switching terminal 22 (FIG. 2), the size selector 5d outputs the run length RRRR(E) from the run-length encoding section 5a (FIG. 2) and the size SSSS(E) and the additional bit string ADBIT(E) from the size/additional bit string generation section 5b to the variable-length encoding section 5c (FIG. 2).

The variable-length encoding section 5c sequentially assigns code words to the run length RRRR/size SSSS combinations from the size selector 5d based on the code table information set in the code table 13 (FIG. 1). The additional bit string ADBIT assigned by the size/additional bit string generation section 5b is attached to the end of each of the assigned code words, thereby producing a variable-length code CODE(E).

For example, among the quantized DCT coefficients illustrated in FIG. 8, the value of the effective coefficient of the 24$^{th}$ AC coefficient (AC24) is +8, as described above. Accordingly, the run length RRRR(E)=1, the size SSSS(E)=4, and the additional bit string ADBIT(E)='1000' are assigned. In this case, the run length/size combination is 1/4, whereby a 9-bit variable-length code '111110110' is assigned as illustrated in FIG. 5. The additional bit string ADBIT(D)='1000' assigned by the size/additional bit string generation section 5b is attached to the end of the 9-bit variable-length code, thereby producing a 13-bit variable-length code CODE(E)='1111101101000'. Thus, a 13-bit variable-length code is assigned to the two quantized DCT coefficients (AC23=0 and AC24=+8) illustrated in FIG. 8. In this way, variable-length codes CODE(E) are sequentially assigned to the run length/size combinations illustrated in FIG. 12.

In the case of the quantized DCT coefficients illustrated in FIG. 8, there are 17 effective coefficients, and accordingly the number of code words to be assigned is 17. Moreover, the length of the code word to be assigned to one run length/size combination is determined based on the code table information set in the code table 13. Typically, the code table information is set so that a code word having a shorter code length is assigned to a run length/size combination of a higher occurrence frequency. For example, in the case of the code table information illustrated in FIG. 5, a 9-bit code word is assigned to a run length/size combination of 1/4, whereas a shorter 7-bit code word is assigned to a run length/size combination of 1/3. This indicates that a run length/size combination of 1/3, which is assigned a shorter code word, has a higher occurrence frequency than that of a run length/size combination of 1/4. The compression efficiency is improved by assigning a shorter code word to a run length/size combination of a higher occurrence frequency as described above.

The variable-length codes CODE(E) produced as described above and other various information required for compression (such as the quantization step values DQT(E) set in the quantization table 12 (FIG. 1) and the code table information DHT(E) set in the code table 13 (FIG. 1)) are multiplexed together by the multiplexing circuit 6 (FIG. 1) ,thereby producing compressed image data JPGDO. The compressed image data JPGDO is written into the code memory 7 (FIG. 1).

Code Amount Changing Operation

Figure 13:
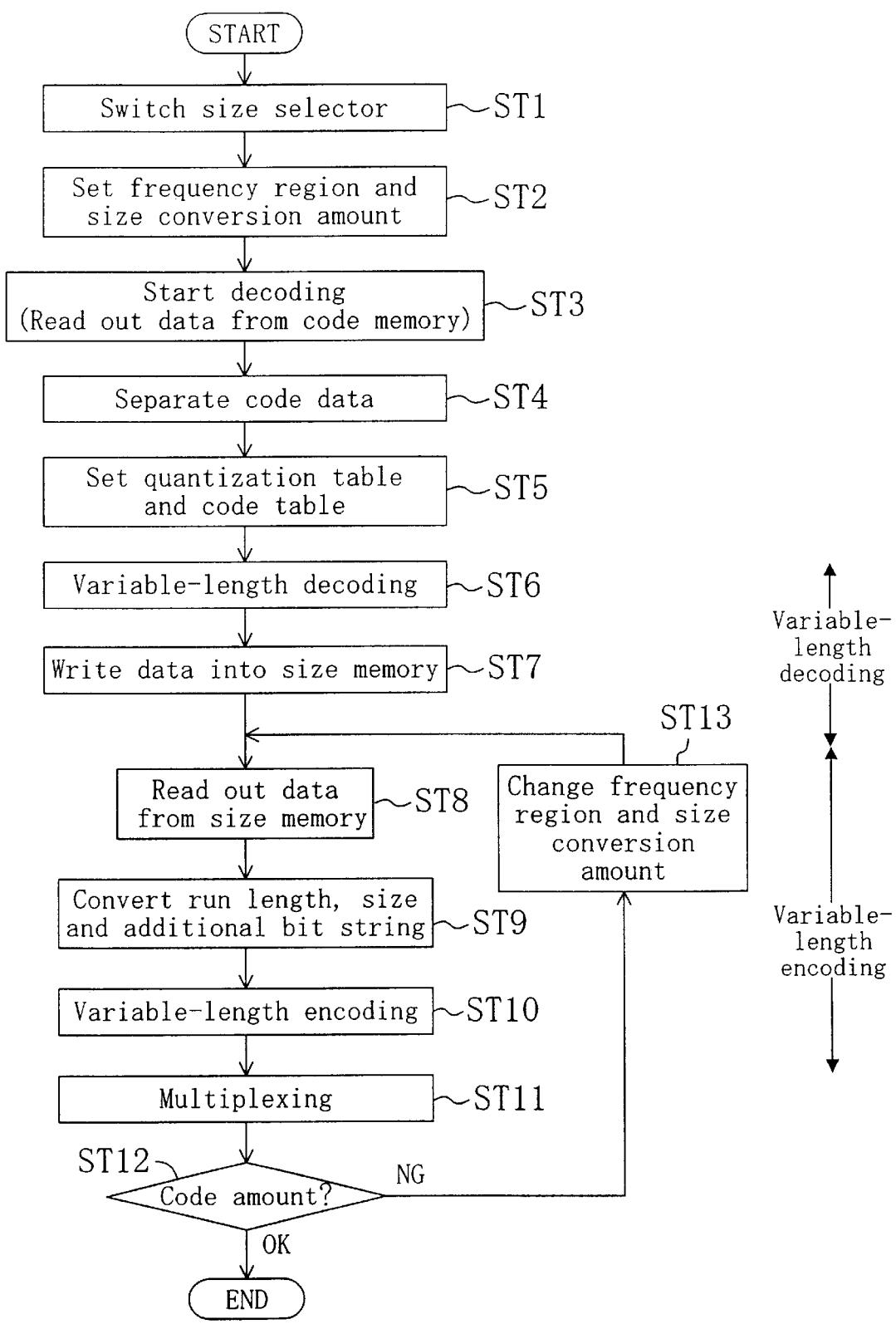
FIG. 13 is a flow chart illustrating a procedure of a code amount changing operation by the image compression/expansion device illustrated in FIG. 1.

Next, the operation of changing the code amount of compressed image data stored in the code memory 7 (FIG. 1) ("code amount changing operation") will be described with reference to FIG. 13.

The compressed image data recorded in the code memory 7 may be data which has been compressed by the image compression/expansion device 1 illustrated in FIG. 1, or other data which has been similarly processed as in the compression operation as described above by a device other than the image compression/expansion device 1 illustrated in FIG. 1 (e.g., data downloaded from the Internet).

First, in step ST1, a control signal is applied to the switching terminal 22 (FIG. 2), thereby switching the output of the size selector 5d (FIG. 2). Thus, the run length RRRR(C), the size SSSS(C) and the additional bit string ADBIT(C) from the size conversion section 5f (FIG. 2) are selected and output to the variable-length encoding section 5c (FIG. 2).

Then, in step ST2, a frequency region and a conversion amount are set in the size conversion table 5e (FIG. 2) via the setting terminal 23 (FIG. 2). The size conversion table 5e is an 8×8 table as illustrated in FIG. 14. The cells of the size conversion table 5e respectively correspond to the cells of the table of quantized DCT coefficients illustrated in FIG. 8. Therefore, in the table of FIG. 14, the frequency increases through the array of cells from left to right and from top to bottom. A conversion amount (−1 or −2 in this example) is set for each of the cells within a frequency region L1 for which a size conversion is to be performed. The size of the effective coefficient of the cell for which a conversion amount of −1 is set will be reduced by 1, and the size of the effective coefficient of the cell for which a conversion amount of −2 is set will be reduced by 2, by the size conversion section 5f in such a manner as will be described later. Moreover, zero is set for each cell in the frequency region for which a size conversion is not to be performed. The frequency region L1 and the conversion amount are set as described above.

Then, in step ST3, compressed image data JPGDI is read out from the code memory 7 (FIG. 1).

Then, in step ST4, the read-out compressed image data JPGDI is separated by the separation circuit 8 (FIG. 1) into quantization step values DQT(D), code table information DHT(D) representing the correspondence between run length/size combinations and code words, and variable-length codes CODE(D) . Then, in step ST5, the quantization step values DQT(D) are set in the quantization table 12 (FIG. 1), and the code table information DHT(D) is set in the code table 13 (FIG. 1). The quantization step values DQT(D) and the code table information DHT(D) are as those illustrated in FIG. 4 and FIG. 5, respectively.

Then, in step ST6, the variable-length decoding section 9c (FIG. 3) decodes each variable-length code CODE(D) into a run length RRRR(D), a size SSSS(D) and an additional bit string ADBIT(D) based on the code table information set in the code table 13.

For example, when decoding a variable-length code CODE(E)='11111101101000', a run length RRRR(D)/size SSSS(D) combination=1/4 is extracted from a bit string of '111110110', which is the first nine bits of the variable-length code CODE(E), based on the code table information illustrated in FIG. 5. Since the extracted size SSSS(D) is 4, the length of the additional bit string ADBIT(D) is 4 bits. Accordingly, the 4-bit string '1000', following the first nine bits, of the variable-length code CODE(E) is extracted as the additional bit string ADBIT(D).

Then, in step ST7, the size memory control section 15 (FIG. 1) controls the size memory 14 in the write mode, whereby the run lengths RRRR(D), the sizes SSSS(D) and the additional bit strings ADBIT(D) decoded by the variable-length decoding section 9c (FIG. 3) are written into the size memory 14 (FIG. 1). The operations up to the variable-length decoding operation (ST3–ST7) are performed for all of the variable-length codes in the compressed image data stored in the code memory 7 (FIG. 1), and the results thereof are temporarily written into the size memory 14.

Then, in step ST8, the size memory control section 15 controls the size memory 14 in the read mode, whereby the run length RRRR(M)/size SSSS(M) combinations and the additional bit strings ADBIT(M) are sequentially read out therefrom. The read-out run length RRRR(M)/size SSSS(M) combinations and the additional bit strings ADBIT(M) are input to the size conversion section 5f (FIG. 2).

Then, in step ST9, the run lengths RRRR(M), the sizes SSSS(M) and the additional bit strings ADBIT(M) input to the size conversion section 5f are sequentially converted based on the frequency region and the size conversion amount set in the size conversion table 5e.

A case where the run length RRRR(M)/size SSSS(M) combinations as illustrated in FIG. 12 are input to the size conversion section 5f, and are converted based on the values as illustrated in FIG. 14, will be described below.

Among the run length/size combinations illustrated in FIG. 12, those included in the frequency region L1 illustrated in FIG. 14 are 6/5, 1/4, 1/5, 4/5, 1/5 and 2/5. Referring to FIG. 14, the conversion amounts respectively corresponding to these combinations are −1, −1, −1, −2, −2 and −2. Therefore, the run length/size combinations after the size conversion are 6/4, 1/3, 1/4, 4/3, 1/3 and 2/3 as illustrated in FIG. 15. The other combinations are not subjected to the size conversion and remain unchanged.

Moreover, when the size conversion table 5e is set as illustrated in FIG. 16, the run length RRRR(C)/size SSSS(C) combinations after the size conversion are as illustrated in FIG. 17. In this example, among the combinations illustrated in FIG. 12, the combination 1/4 that is included in a frequency region L2 illustrated in FIG. 16 will have a size of zero after the size conversion. Accordingly, the run length of the combination 1/5 that follows this combination 1/4 in FIG. 12 is changed from 1 to 3. Thus, when a run length/size combination is size-converted to have a size of zero or a size of a negative value, the run length of the following run length/size combination is changed accordingly.

The conversion of the additional bit string ADBIT(M) is performed through a shift operation according to the size conversion amount. When the size conversion amount is set to "−2" and the additional bit string ADBIT(M) of '10011' is input, for example, the lower two bits '11' of the input additional bit string ADBIT(M) are nullified and the remaining upper bit string '100' is used as the converted additional bit string ADBIT(C). Therefore, the number of additional bits after the conversion is as shown in parentheses in FIG. 15.

Note that the method of converting an additional bit string is not limited to the above. In an alternative method, for example, if the most significant bit of an input additional bit string ADBIT(M) is '0', the following effective bits are all set to '0', whereas if the most significant bit of an input additional bit string ADBIT(M) is '1', the following effective bits are all set to '1'. For example, an additional bit string ADBIT(M)='10011' is converted to an additional bit string ADBIT(C)='111'.

The run length RRRR(C), the size SSSS (C) and the additional bit string ADBIT(C) obtained as described above are selected by the size selector 5d (FIG. 2) and input to the variable-length encoding section 5c (FIG. 2).

Then, in step ST10, a variable-length code is assigned to each run length RRRR(C)/size SSSS(C) combination by the variable-length encoding section 5c based on the code table information illustrated in FIG. 5. Moreover, an additional bit string is attached to the end of the assigned variable-length code, thereby producing a variable-length code CODE(E).

Figure 18:
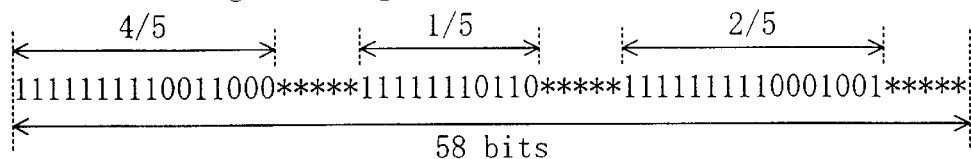
FIG. 18 is a diagram illustrating the difference between a code amount before size conversion and that after size conversion.
Figure 18:
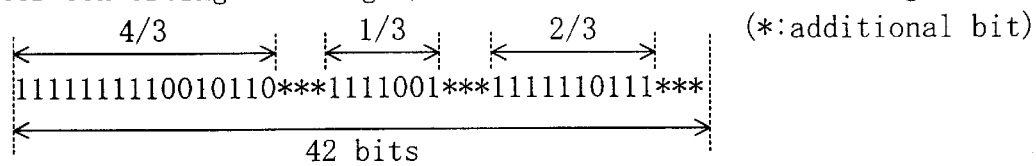

Now consider the code amount before the size conversion and that after the size conversion for the run length/size combinations 4/5, 1/5 and 2/5 in the high frequency region among the run length/size combinations illustrated in FIG. 12. As illustrated in FIG. 18, the length of the variable-length code assigned before converting the run length/size combinations is 58 bits, whereas that after the conversion is 42 bits.

Thus, the code amount of a variable-length code can be changed by performing the size conversion for some of the run length RRRR(D)/size SSSS(D) combinations and the additional bit strings ADBIT(D) obtained by the variable-length decoding section 9c (FIG. 3) that are within a predetermined frequency region, and then sequentially performing the variable-length encoding operation on the obtained data.

Then, in step ST11, the variable-length codes CODE(E) and other various information required for compression (such as the quantization step values DQT(E) set in the quantization table 12 (FIG. 1) and the code table information DHT(E) set in the code table 13 (FIG. 1)) are multiplexed together by the multiplexing circuit 6 (FIG. 1), thereby producing compressed image data JPGDO. The compressed image data JPGDO is written into the code memory 7.

Then, instep ST12, it is determined whether the code amount of the obtained compressed image data is a desired value. If the code amount is a desired value, the process is terminated. Otherwise, the process proceeds to step ST13.

Then, in step ST13, the frequency region and the size conversion amount, which are set in the size conversion table 5e (FIG. 2), are changed.

For example, when the code amount of the produced compressed image data is greater than the desired value, the size of the frequency region is increased, whereas when the code amount is less than the desired value, the size of the frequency region is reduced.

Similarly for the size conversion amount, when the code amount is greater than the desired value, the size conversion amount is increased, whereas when the code amount is less than the desired value, the size conversion amount is reduced.

The setting can be changed by increasing or reducing either or both of the size of the frequency region and the size conversion amount.

After changing the setting, steps ST8–ST12 are performed again.

As described above, steps ST8–ST12 are repeated while changing the frequency region and/or the size conversion amount in the size conversion table 5e until compressed image data of a desired code amount is produced. Thus, it is possible to obtain compressed image data having a desired code amount.

As described above, the image compression/expansion device 1 according to the first embodiment is provided with the size conversion table 5e and the size conversion section 5f, thereby eliminating the need to perform the operations required for recovering the original image (such as run-length decoding, inverse quantization, and inverse DCT) and the operations required for compressing the image (such as DCT, quantization, run-length encoding). Thus, it is possible to efficiently change the code amount of compressed image data.

Note that with the image compression/expansion device 1 according to the first embodiment, the quantization step values which are set in the quantization table 12 (FIG. 1) are not changed. Thus, the run lengths, the sizes, the additional bit strings and the quantization step values are multiplexed together after only the run lengths, the sizes and the additional bit strings are converted, while the quantization step values are left unchanged. As a result, when the newly produced compressed image data is expanded, there may be some deterioration in the recovered image. In view of this, it is preferred that the frequency region, which is set in the size conversion table 5e, is confined to a high frequency region as much as possible so that the deterioration in the image quality can be suppressed to a level such that it is not perceivable by human eyes.

A recovered image can be obtained from the compressed image data stored in the code memory 7 (FIG. 1) through an image expansion operation as follows.

Image Expansion Operation

First, compressed image data JPGDI is read out from the code memory 7 (FIG. 1).

The read-out compressed image data JPGDI is separated by the separation circuit 8 (FIG. 1) into quantization step values DQT(D), code table information DHT(D) representing the correspondence between run length/size combinations and code words, and variable-length codes CODE(D). The quantization step values DQT(D) are set in the quantization table 12, and the code table information DHT(D) is set in the code table 13.

The variable-length codes CODE(D) are input to the variable-length decoding section 9c (FIG. 3). The variable-length decoding section 9c decodes each variable-length code CODE(D) into a run length RRRR(D), a size SSSS(D) and an additional bit string ADBIT(D) based on the code table information set in the code table 13.

For example, when a variable-length code '1111101101000' is decoded based on the code table information illustrated in FIG. 5, a run length RRRR(D)/size SSSS(D) combination=1/4 is extracted from the upper 9-bit string '111110110'. Moreover, since the extracted size SSSS (D) is 4, the length of the additional bit string ADBIT(D) is 4 bits. Therefore, the 4-bit string '1000', following the first nine bits, of the variable-length code is extracted as the additional bit string ADBIT(D).

The size SSSS(D) and the additional bit string ADBIT(D) are input to the coefficient generation section 9b (FIG. 3). The relationship among the effective coefficient, the size and the additional bit string (the number of additional bits) is as illustrated in FIG. 11.

As illustrated in FIG. 11, when the size SSSS(D) is 4, the effective coefficient may take any of 16 possible values (−15, −14, . . . , −8, +8, . . . , +14, +15). However, since the additional bit string ADBIT(D) is '1000', the ninth smallest value (the ninth value from the left side of the figure), i.e., +8, is specified as the DCT coefficient Sq(D). As described above, a size SSSS(D) and an additional bit string ADBIT (D) are used to specify an effective coefficient Sq(D).

The run length RRRR(D) and the effective coefficient Sq(D) are input to the run-length decoding section 9a (FIG. 3).

The run-length decoding section 9a produces DCT coefficients from the run length RRRR(D)/effective coefficient Sq(D) combination. For example, when the run length RRRR(D)/effective coefficient sq(D) combination is 1/+8, DCT coefficients of 0 and +8 are produced. The produced DCT coefficients are output in the order of zigzag scanning as illustrated in FIG. 9.

The DCT coefficients are inverse-quantized by the inverse quantization section 10 (FIG. 1) based on the quantization step values set in the quantization table 12.

The inverse-quantized DCT coefficients are further subjected to a two-dimensional inverse DCT operation by the inverse DCT section 11 (FIG. 1). The results of the inverse DCT are sequentially written into the image memory 2 (FIG. 1) as recovered image data PXLDO.

Compressed image data can be expanded as described above.

Second Embodiment

Figure 19:
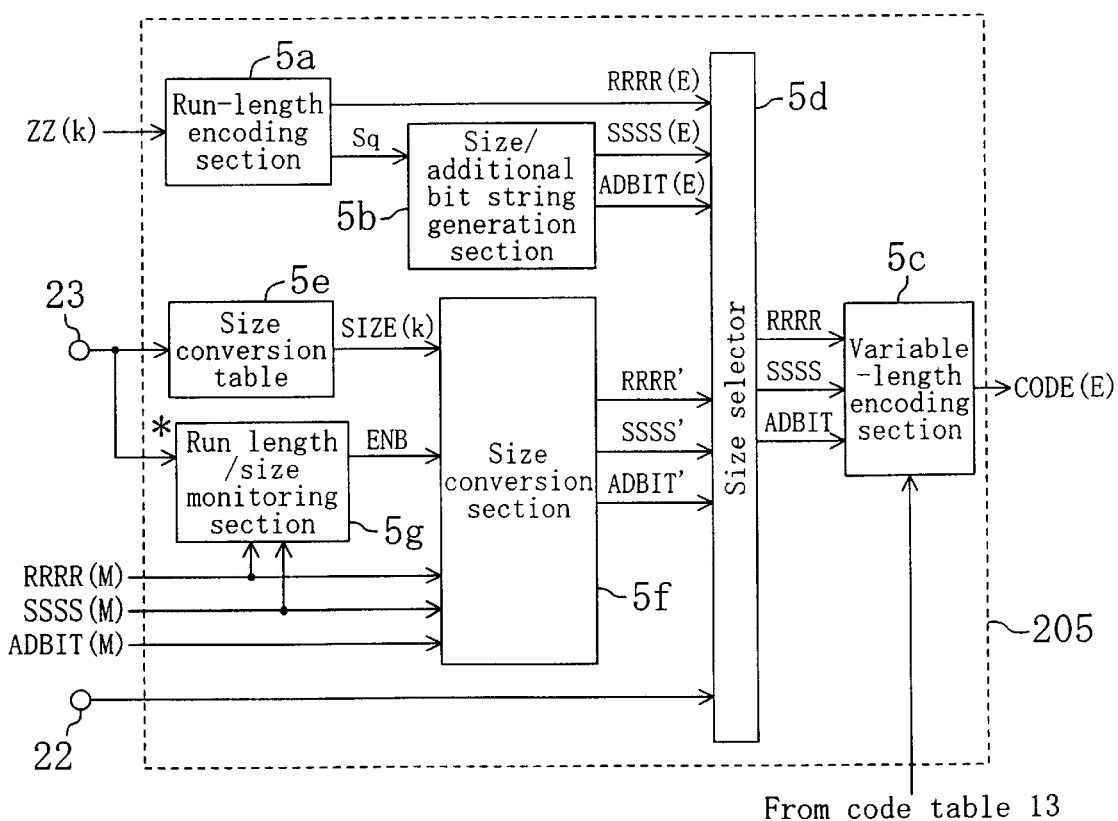
FIG. 19 is a block diagram illustrating an internal configuration of an encoding section in an image compression/expansion device according to the second embodiment of the present invention.

An image compression/expansion device according to the second embodiment of the present invention includes an encoding section 205 illustrated in FIG. 19 instead of the encoding section 5 illustrated in FIG. 1 and FIG. 2. Other than this, the configuration of the image compression/expansion device is as that of the image compression/expansion device 1 illustrated in FIG. 1.

Referring to FIG. 19, the encoding section 205 includes a run length/size monitoring section 5g in addition to the configuration of the encoding section 5 illustrated in FIG. 2.

The run length/size monitoring section 5g outputs an active enable signal ENB to the size conversion section 5f when the run length RRRR(M)/size SSSS(M) combination that is read out from the size memory 14 (FIG. 1) is a predetermined combination, and outputs an inactive enable signal ENB to the size conversion section 5f when it is not the predetermined combination. The size conversion section 5f performs a conversion operation when it receives the active enable signal ENB and does not perform a conversion operation when it receives the inactive enable signal ENB.

Now consider a case where the code table information as illustrated in FIG. 5 is set in the code table 13 illustrated in FIG. 1. In view of the code lengths of the code words, it can be seen that there are some cases where the code length assigned to a run length/size combination remains unchanged even if the size is changed for a particular frequency region in a manner as described in the first embodiment. For example, when the size of a run length/size combination of 2/7 is changed by "−2" so as to convert the combination into a combination of 2/5, the code length of a variable-length code assigned to the combination 2/7 and that of a variable-length code assigned to the combination 2/5 are both 16 bits. The only thing that is changed is the number of additional bits, which changes along with the change in the size. Thus, a significant effect of reducing the code amount is not obtained.

On the other hand, even when a conversion is performed on each run length/size combination, the quantization step values which are set in the quantization table 12 (FIG. 1) are not changed, whereby the image quality may deteriorate when an image recovery operation is performed on the obtained image as described above. Thus, in some cases, the deterioration in the image quality may be significant while there is only a little effect of reducing the code amount. The second embodiment addresses this problem.

Figure 20:
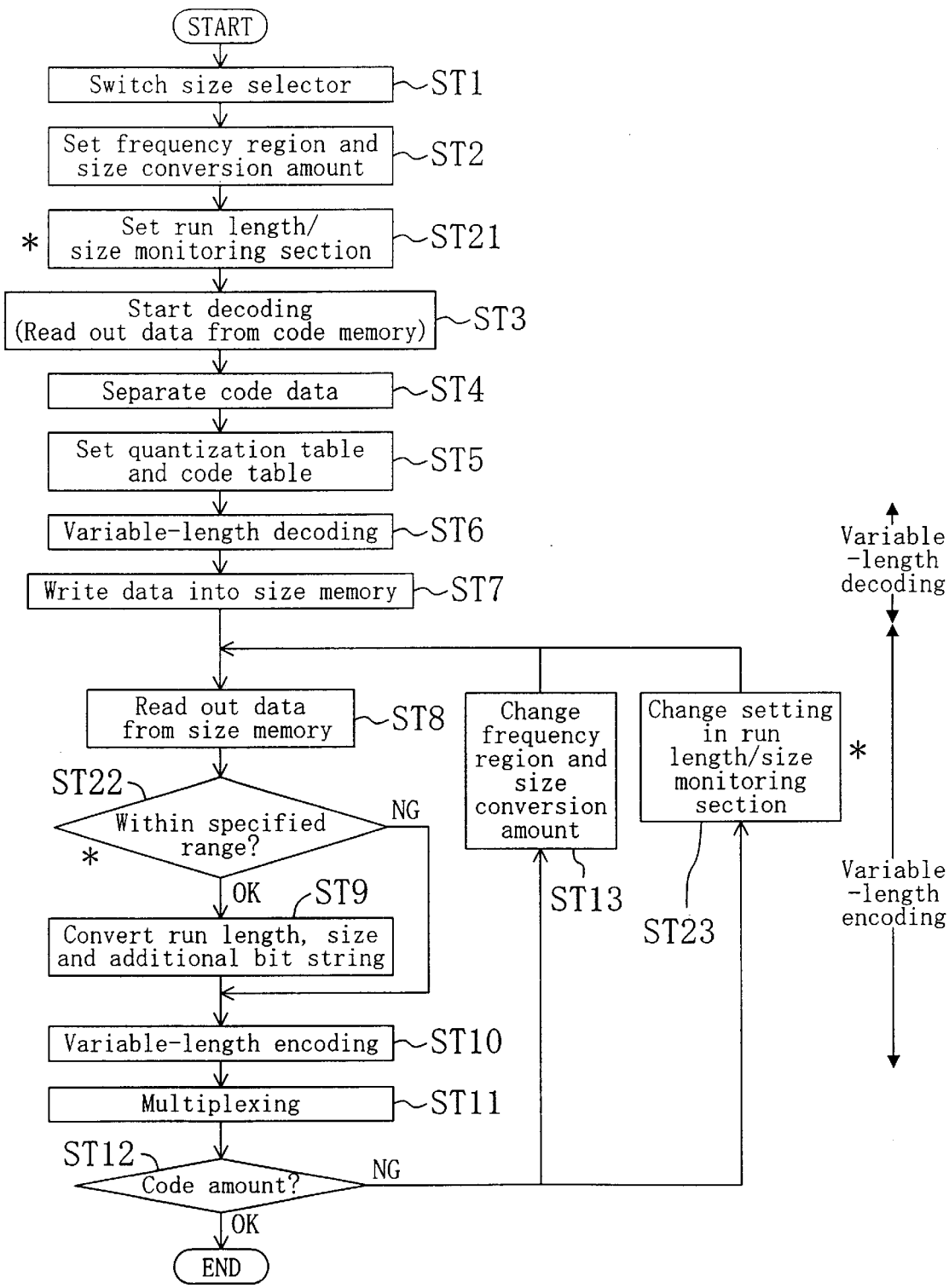
FIG. 20 is a flow chart illustrating a procedure of a code amount changing operation by the image compression/expansion device according to the second embodiment of the present invention.

A code amount changing operation performed by the image compression/expansion device according to the second embodiment of the present invention will now be described with reference to FIG. 20. Note that only steps ST21–ST23, which are not present in the operation of the first embodiment as illustrated in FIG. 13, will be described.

In step ST21, run length/size combinations as illustrated in FIG. 21 are set in the run length/size monitoring section 5g (FIG. 19).

In step ST22, if the size SSSS(M) that is read out from the size memory 14 (FIG. 1) is equal to or greater than the size that is set for the same run length as the run length RRRR(M) read out from the size memory 14, the run length/size monitoring section 5g (FIG. 19) outputs an active enable signal ENB, and the process proceeds to step ST9, where a conversion is performed by the size conversion section 5f (FIG. 19). If the size SSSS(M) is smaller than the size that is set for the same run length as the run length RRRR(M), the run length/size monitoring section 5g (FIG. 19) outputs an inactive enable signal ENB, and the process proceeds to step ST10 without converting the run length/size combination by the size conversion section 5f (FIG. 19). In this way, the run length/size monitoring section 5g specifies particular combinations to be converted among the run length RRRR(M)/size SSSS(M) combinations that are read out from the size memory 14.

When the code amount of the produced compressed image data is not a desired value, the setting of the run length/size combinations in the run length/size monitoring section 5g (FIG. 19) is changed in step ST23.

As described above, in the second embodiment, the run length/size monitoring section 5g is provided, whereby it is possible to perform a conversion operation only on some run length/size combinations for which a code amount reducing effect can be obtained. As a result, it is possible to suppress the deterioration in the image quality which may occur when an image recovery operation is performed on a compressed image.

Third Embodiment

The image compression/expansion device 1 according to the first embodiment performs a conversion operation on each run length/size combination obtained from a decoding section, and performs a variable-length encoding operation on the converted run length/size combination. In contrast, an image compression/expansion device 301 according to the third embodiment performs a conversion operation on each run length/effective coefficient combination obtained from a decoding section, and performs a variable-length encoding operation on the converted run length/effective coefficient combination.

Figure 22:
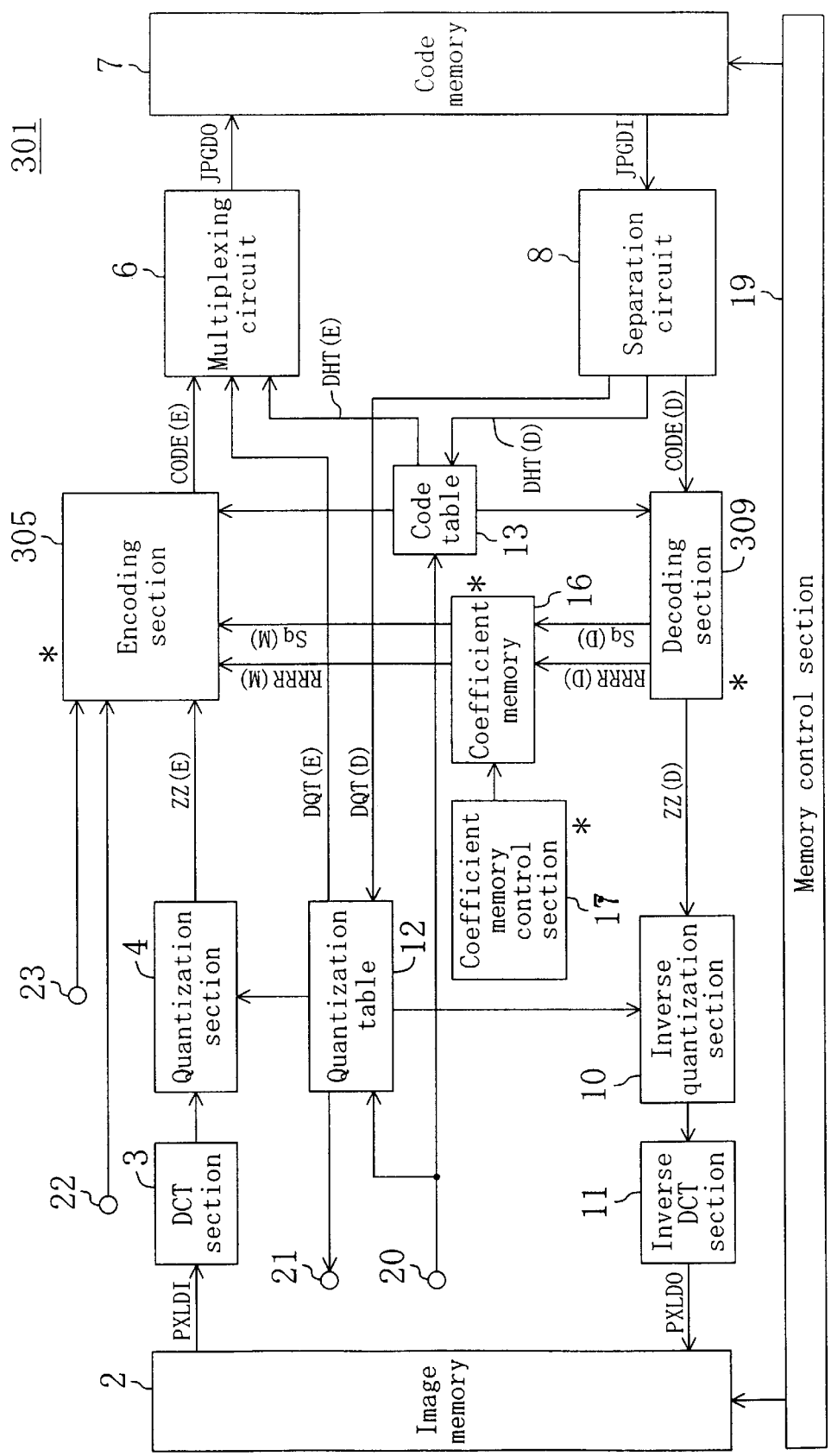
FIG. 22 is a block diagram illustrating an overall configuration of an image compression/expansion device according to the third embodiment of the present invention.

FIG. 22 is a block diagram illustrating an overall configuration of the image compression/expansion device 301 according to the third embodiment of the present invention. Referring to FIG. 22, the image compression/expansion device 301 includes an encoding section 305, a decoding section 309, a coefficient memory 16 and a coefficient memory control section 17 instead of the encoding section 5, the decoding section 9, the size memory 14 and the size memory control section 15 illustrated in FIG. 1. Other than this, the configuration of the image compression/expansion device 301 is as that of the image compression/expansion device 1 illustrated in FIG. 1.

The coefficient memory 16 temporarily stores the run length RRRR(D) and the effective coefficient Sq(D) from the decoding section 309. The coefficient memory control section 17 controls writing/reading of data into/from the coefficient memory 16.

Figure 23:
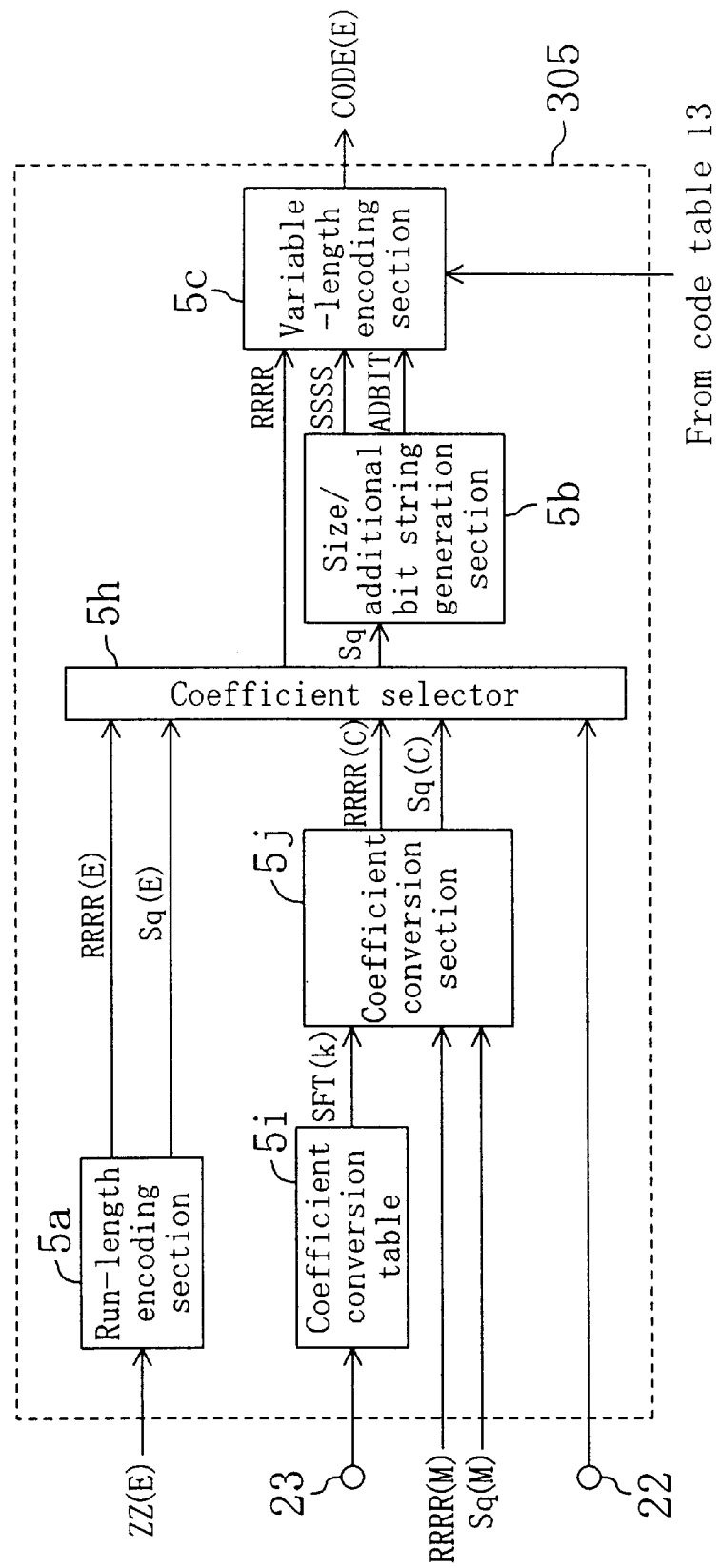
FIG. 23 is a block diagram illustrating an internal configuration of an encoding section illustrated in FIG. 22.

FIG. 23 is a block diagram illustrating an internal configuration of the encoding section 305 illustrated in FIG. 22. Referring to FIG. 23, the encoding section 305 includes a run-length encoding section 5a, a size/additional bit string generation section 5b, a variable-length encoding section 5c, a coefficient selector 5h, a coefficient conversion table 5i and a coefficient conversion section 5j.

A frequency region and a coefficient conversion amount are set in the coefficient conversion table 5i via the setting terminal 23. The coefficient conversion section 5j converts the run length RRRR(M) and the effective coefficient Sq(M) that are read out from the coefficient memory 16 (FIG. 22) based on the frequency region and the coefficient conversion amount SFT(k) set in the coefficient conversion table 5i. The coefficient selector 5h selectively outputs either the run length RRRR(E)/effective coefficient Sq(E) combination from the run-length encoding section 5a or the run length RRRR(C)/effective coefficient Sq(C) combination from the coefficient conversion section 5j. The size/additional bit string generation section 5b assigns a size SSSS and an additional bit string ADBIT to the effective coefficient Sq from the coefficient selector 5h.

Figure 24:
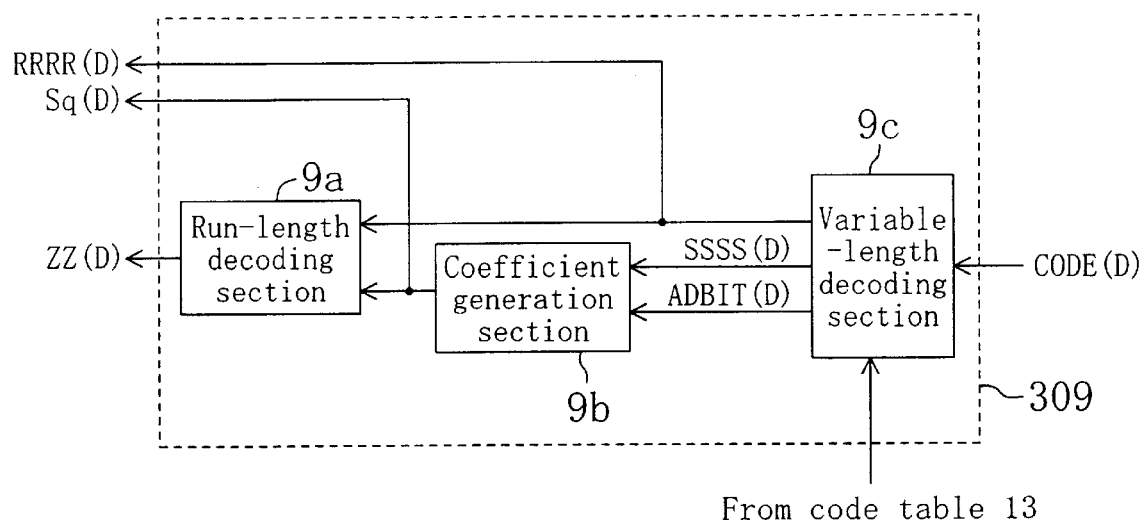
FIG. 24 is a block diagram illustrating an internal configuration of a decoding section illustrated in FIG. 22.

FIG. 24 is a block diagram illustrating an internal configuration of the decoding section 309 illustrated in FIG. 22. Referring to FIG. 24, the decoding section 309 includes a run-length decoding section 9a, a coefficient generation section 9b and a variable-length decoding section 9c. The run-length decoding section 9a, the coefficient generation section 9b and the variable-length decoding section 9c are as those illustrated in FIG. 3. The decoding section 309 is different from the decoding section 9 illustrated in FIG. 3 in that the run length RRRR(D) from the variable-length decoding section 9c and the effective coefficient Sq(D) from the coefficient generation section 9b are output to the coefficient memory 16 (FIG. 22).

Figure 25:
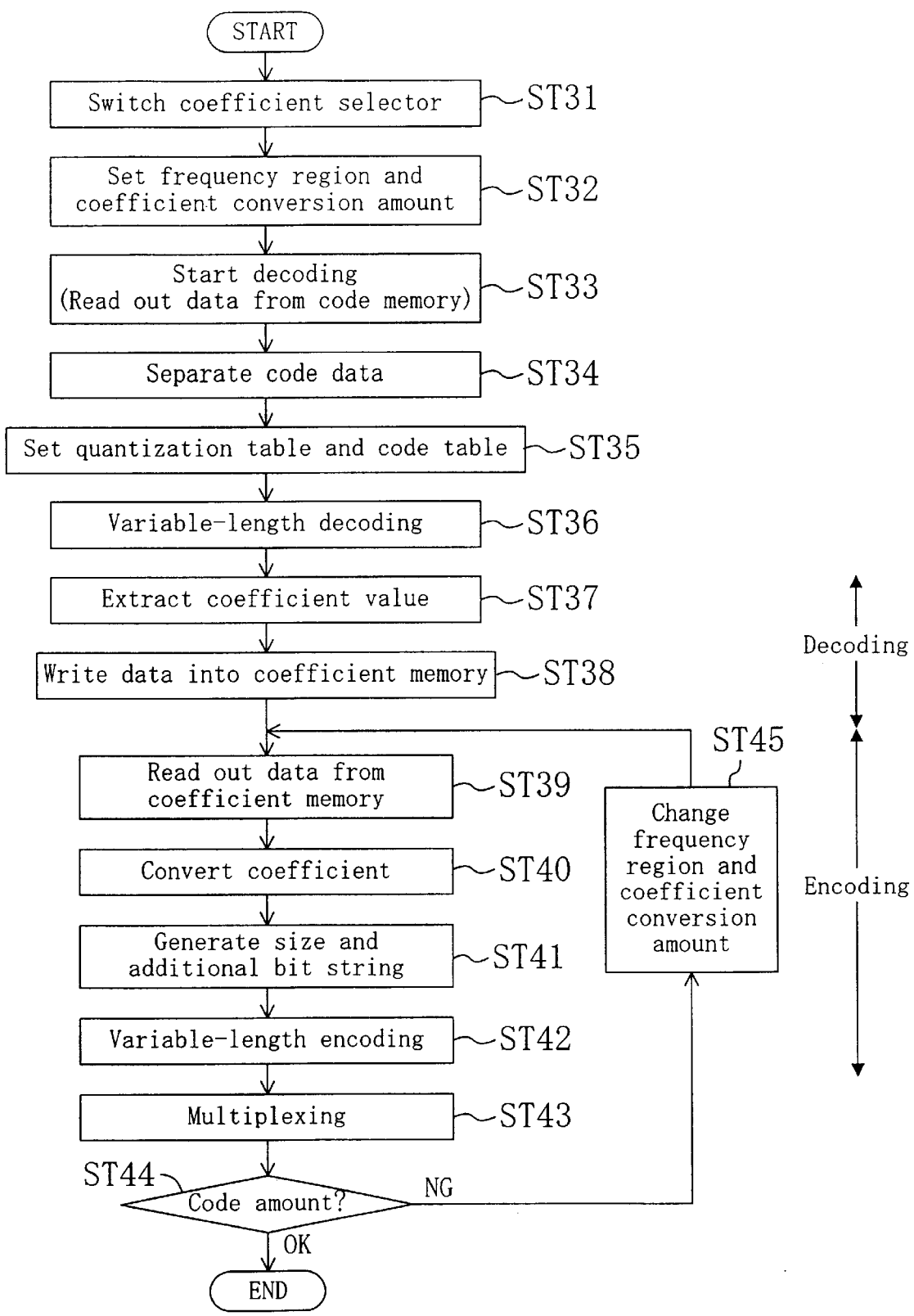
FIG. 25 is a flow chart illustrating a procedure of a code amount changing operation by the image compression/expansion device illustrated in FIG. 22.

A code amount changing operation performed by the image compression/expansion device 301 illustrated in FIG. 22 will now be described with reference to FIG. 25.

First, in step ST31, a control signal (not shown) is applied to the switching terminal 22 (FIG. 23) to switch the output of the coefficient selector 5h (FIG. 23). Therefore, the run length RRRR(C) and the effective coefficient Sq(C) from the coefficient conversion section 5j (FIG. 23) are selected and output to the variable-length encoding section 5c (FIG. 23) and the size/additional bit string generation section 5b (FIG. 23), respectively.

Then, in step ST32, a frequency region and a coefficient conversion amount are set in the coefficient conversion table 5i (FIG. 23) via the setting terminal 23 (FIG. 23). The coefficient conversion table 5i is an 8×8 table as illustrated in FIG. 26. The cells of the coefficient conversion table 5i respectively correspond to the cells of the table of quantized DCT coefficients illustrated in FIG. 8. Therefore, in the table of FIG. 26, the frequency increases through the array of cells from left to right and from top to bottom. A coefficient conversion amount (−1 or −2 in this example) is set for each of the cells within a frequency region L3 for which the value of the effective coefficient is to be converted. The effective coefficient of the cell for which a coefficient conversion amount of −1 is set will be shifted by one bit to the right to cut off the lower one bit, and the effective coefficient of the cell for which a coefficient conversion amount of −2 is set will be shifted by two bits to the right to cut off the lower two bits, by the coefficient conversion section 5j in such a manner as will be described later. Moreover, zero is set for each cell in the frequency region for which the value of the effective coefficient is not to be converted. The frequency region L3 and the coefficient conversion amount are set as described above.

Then, in step ST33, compressed image data JPGDI is read out from the code memory 7 (FIG. 22).

Then, in step ST34, the read-out compressed image data JPGDI is separated by the separation circuit 8 (FIG. 22) into quantization step values DQT(D), code table information DHT(D) representing the correspondence between run length/size combinations and code words, and variable-length codes CODE(D). Then, in step ST35, the quantization step values DQT(D) are set in the quantization table 12 (FIG. 22), and the code table information DHT(D) is set in the code table 13 (FIG. 22). For example, the quantization step value DQT(D) and the code table information DHT(D) are as those illustrated in FIG. 4 and FIG. 5, respectively.

Then, in step ST36, the variable-length decoding section 9c (FIG. 24) decodes the variable-length code CODE(D) into the run length RRRR(D), the size SSSS(D) and the additional bit string ADBIT(D) based on the code table information set in the code table 13 (FIG. 22).

Referring to FIG. 5, when decoding a variable-length code CODE(E)='1111101101000', for example, a run length RRRR(D)/size SSSS(D) combination=1/4 is extracted from the upper 9-bit string '111110110'. Since the extracted size SSSS(D) is 4, the length of additional bit string ADBIT(D) is 4 bits. Accordingly, the 4-bit string '1000', following the first nine bits, of the variable-length code CODE(E) is extracted as the additional bit string ADBIT(D).

Then, in step ST37, the coefficient generation section 9b (FIG. 24) produces an effective coefficient Sq(D) from the size SSSS(D) and the additional bit string ADBIT(D).

For example, as illustrated in FIG. 10, when the size SSSS(D) is 4, the effective coefficient may take any of 16 possible values (−15, −14, . . . , −8, +8, . . . , +14, +15). However, since the additional bit string ADBIT(D) is '1000', the ninth smallest value (the ninth value from the left side of the figure), i.e., +8, is specified as the effective coefficient Sq(D).

Then, in step ST38, the coefficient memory control section 17 (FIG. 22) controls the coefficient memory 16 (FIG. 22) in the write mode, whereby the run length RRRR(D) from the variable-length decoding section 9c (FIG. 24) and the effective coefficient Sq(D) from the coefficient generation section 9b (FIG. 24) are written into the coefficient memory 16 (FIG. 22). Thus, the operation up to variable-length decoding is performed for all of the variable-length codes in the compressed image data, and the results thereof are temporarily written into the coefficient memory 16.

Then, in step ST39, the coefficient memory control section 17 (FIG. 22) controls the coefficient memory 16 (FIG. 22) in the read mode, whereby the run length RRRR(M)/effective coefficient Sq(M) combinations are sequentially read out. The read-out run length RRRR(M)/effective coefficient Sq(M) combinations are input to the coefficient conversion section 5j (FIG. 23).

Then, in step ST40, the run length RRRR(M)/effective coefficient Sq(M) combinations which have been input to the coefficient conversion section 5j are sequentially converted based on the frequency region and the coefficient conversion amount set in the coefficient conversion table 5i (FIG. 23).

A case where the run length RRRR(M)/effective coefficient Sq(M) combinations as illustrated in FIG. 10 are input to the coefficient conversion section 5j (FIG. 23), and are converted based on the values as illustrated in FIG. 26, will be described below.

Among the run length/effective coefficient combinations illustrated in FIG. 10, those included in the frequency region L3 illustrated in FIG. 26 are 9/21, 1/9, 1/9, 1/21, 6/20, 1/10, 1/20, 4/30, 1/30 and 2/28. Referring to FIG. 26, the coefficient conversion amounts respectively corresponding to these combinations are −1, −1, −1, −1, −1, −1, −1, −2, −2 and −2. The coefficient conversion section 5j shifts each effective coefficient corresponding to the coefficient conversion amount of −1 by one bit to the right to cut off the lower one bit, and shifts each effective coefficient corresponding to the coefficient conversion amount of −2 by two bits to the right to cut off the lower two bits. Therefore, the run length/effective coefficient combinations after the coefficient conversion are 9/10, 1/4, 1/4, 1/10, 6/10, 1/5, 1/10, 4/8, 1/8 and 2/7 as illustrated in FIG. 27. The effective coefficients of the other combinations are not subjected to the conversion and remain unchanged.

The run lengths RRRR(C) and the effective coefficients Sq(C) thus obtained are input to the variable-length encoding section 5c (FIG. 23) and the size/additional bit string generation section 5b (FIG. 23), respectively.

Then, in step ST41, a size and an additional bit string are assigned to each effective coefficient Sq(C) from the coefficient conversion section 5j (FIG. 23) by the size/additional bit string generation section 5b (FIG.23). The relation ship among the effective coefficient, the size and the additional bit string (the number of additional bits) is as illustrated in FIG. 11. Therefore, the size to be assigned is changed by the bit shift operation on the effective coefficient. Thus, a run length/size combination can be changed by converting a run length/effective coefficient combination.

Then, in step ST42, the variable-length encoding section 5c (FIG. 23) assigns a variable-length code to each combination of the run length RRRR from the coefficient conversion section 5j and the size assigned by the size/additional bit string generation section 5b based on the code table information set in the code table 13 (FIG. 22). Moreover, an additional bit string is attached to the end of the assigned variable-length code, thereby producing a variable-length code CODE(E).

As described above, the code amount of the variable-length code CODE(E) is changed by sequentially performing a variable-length encoding operation while changing the value of the effective coefficient for some of the run length RRRR(D)/effective coefficient Sq(D) combinations obtained by the decoding section 309 (FIG. 22) that are within a predetermined frequency region.

Then, in step ST43, the variable-length codes CODE(E) and other various information required for compression (such as the quantization step values DQT(E) set in the quantization table 12 (FIG. 22) and the code table information DHT(E) set in the code table 13 (FIG. 22)) are multiplexed together by the multiplexing circuit 6 (FIG. 22), thereby producing compressed image data JPGDO. The compressed image data JPGDO is written into the code memory 7.

Then, in step ST44, it is determined whether the code amount of the obtained compressed image data is a desired value. If the code amount is a desired value, the process is terminated. Otherwise, the process proceeds to step ST45.

Then, in step ST45, the frequency region and the coefficient conversion amount, which are set in the coefficient conversion table 5i (FIG. 23), are changed.

For example, when the code amount of the newly produced compressed image data is greater than the desired value, the size of the frequency region is increased, whereas when the code amount is less than the desired value, the size of the frequency region is reduced.

Similarly for the coefficient conversion amount, when the code amount is greater than the desired value, the coefficient conversion amount is increased, whereas when the code amount is less than the desired value, the coefficient conversion amount is reduced.

The setting can be changed by increasing or reducing either or both of the size of the frequency region and the coefficient conversion amount.

After changing the setting, steps ST39–ST44 are performed again.

As described above, steps ST39–ST44 are repeated while changing the frequency region and/or the coefficient conversion amount in the coefficient conversion table 5i until the code amount of the produced compressed image data is a desired value. Thus, it is possible to obtain compressed image data having a desired code amount.

As described above, the image compression/expansion device according to the third embodiment is provided with coefficient conversion table 5i and the coefficient conversion section 5j, thereby eliminating the need to perform the operations required for recovering the original image (such as run-length decoding, inverse quantization, and inverse DCT) and the operations required for compressing the image (such as DCT, quantization, run-length encoding). Thus, it is possible to efficiently change the code amount of compressed image data.

Note that in the present embodiment, the quantization step values which are set in the quantization table 12 are not changed. Thus, the run lengths, the sizes, the additional bit strings and the quantization step values are multiplexed together after only the run lengths, the sizes and the additional bit strings are converted, while the quantization step values are left unchanged. As a result, when the newly produced compressed image data is expanded, there may be some deterioration in the recovered image. In view of this, it is preferred that the frequency region, which is set in the coefficient conversion table 5i, is confined to a high frequency region as much as possible so that the deterioration in the image quality can be suppressed to a level such that it is not perceivable by human eyes.

Fourth Embodiment

Figure 28:
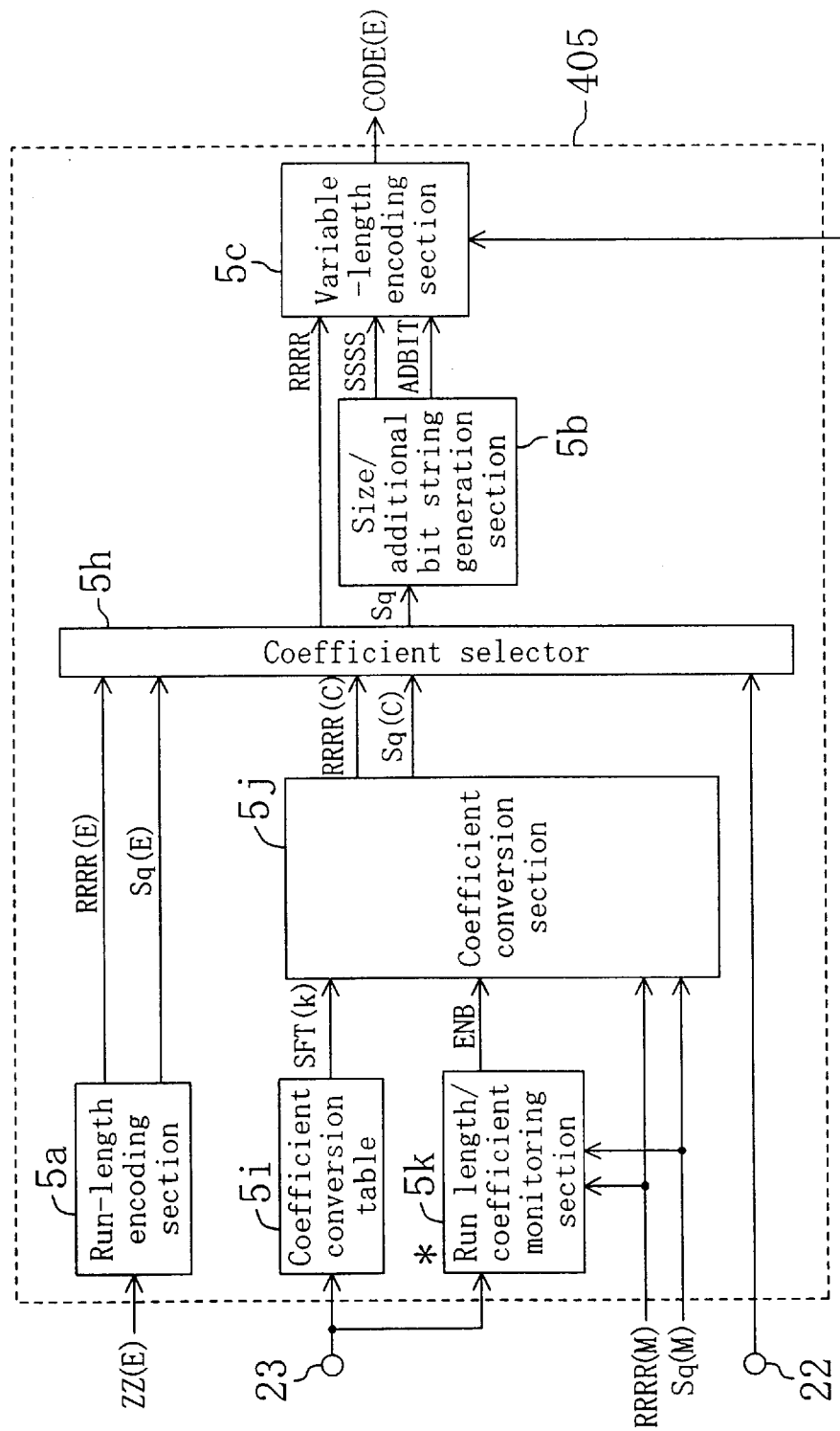
FIG. 28 is a block diagram illustrating an internal configuration of an encoding section in an image compression/expansion device according to the fourth embodiment of the present invention.

An image compression/expansion device according to the fourth embodiment of the present invention includes an encoding section 405 illustrated in FIG. 28 instead of the encoding section 305 illustrated in FIG. 22. Other than this, the configuration of the image compression/expansion device is as that of the image compression/expansion device illustrated in FIG. 22.

Referring to FIG. 28, the encoding section 405 includes a run length/coefficient monitoring section 5k in addition to the configuration of the encoding section 305 illustrated in FIG. 23.

The run length/coefficient monitoring section 5k outputs an active enable signal ENB to the coefficient conversion section 5j when the run length RRRR(M)/effective coefficient Sq(M) combination that is read out from the coefficient memory 16 (FIG. 22) is a predetermined combination, and outputs an inactive enable signal ENB to the coefficient conversion section 5j when it is not the predetermined combination. The coefficient conversion section 5j performs a conversion operation on the run length/effective coefficient combination when it receives the active enable signal ENB and does not perform a conversion operation when it receives the inactive enable signal ENB.

The fourth embodiment addresses the same problem as that addressed by the second embodiment (i.e., to suppress the deterioration in the image quality which may occur when an image recovery operation is performed on a compressed image).

Figure 29:
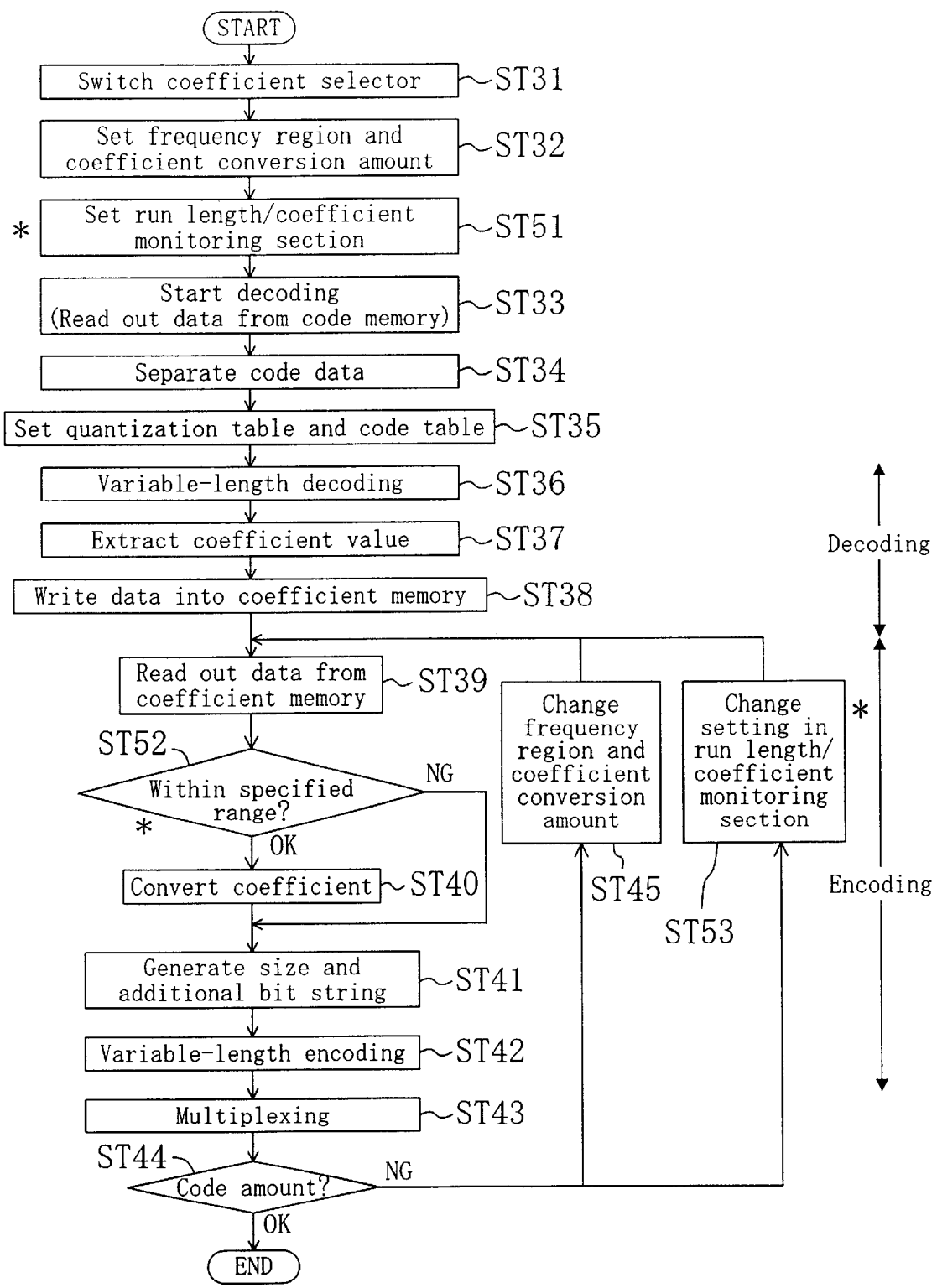
FIG. 29 is a flow chart illustrating a procedure of a code amount changing operation by the image compression/expansion device according to the fourth embodiment of the present invention.

A code amount changing operation performed by the image compression/expansion device according to the fourth embodiment of the present invention will now be described with reference to FIG. 29. Note that only steps ST51–ST53, which are not present in the operation of the third embodiment as illustrated in FIG. 25, will be described.

In step ST51, run length/effective coefficient combinations as illustrated in FIG. 30 are set in the run length/coefficient monitoring section 5k (FIG. 28).

In step ST52, if the effective coefficient Sq(M) that is read out from the coefficient memory 16 (FIG. 22) is equal to or greater than the effective coefficient that is set for the same run length as the run length RRRR(M) read out from the coefficient memory 16 (FIG. 22), the run length/coefficient monitoring section 5k (FIG. 28) outputs an active enable signal ENB, and the process proceeds to step ST40. Then, the coefficient conversion section 5j (FIG. 28) converts the run length/effective coefficient combination. If the effective coefficient Sq(M) is smaller than the effective coefficient that is set for the same run length as the run length RRRR(M), the run length/coefficient monitoring section 5k outputs an inactive enable signal ENB, and the process proceeds to step ST41 without converting the run length/effective coefficient combination by the coefficient conversion section 5j (FIG. 28). In this way, the run length/coefficient monitoring section 5k (FIG. 28) specifies particular combinations to be converted among the run length RRRR(M)/effective coefficient Sq(M) combinations that are read out from the coefficient memory 16 (FIG. 22).

When the code amount of the produced compressed image data is not a desired value, the setting of the run length/effective coefficient combinations in the run length/coefficient monitoring section 5k is changed in step ST53.

As described above, in the fourth embodiment, the run length/coefficient monitoring section 5k is provided, whereby it is possible to perform a conversion operation only on some run length/effective coefficient combinations for which a code amount reducing effect can be obtained. As a result, it is possible to suppress the deterioration in the image quality which may occur when an image recovery operation is performed on a compressed image.

Fifth Embodiment

With the image compression/expansion device 1 according to the first embodiment, the run lengths, the sizes, the additional bit strings and the quantization step values are multiplexed together after only the run lengths, the sizes and the additional bit strings are converted, while the quantization step values are left unchanged. As a result, when the newly produced compressed image data is expanded, there may be some deterioration in the recovered image. An image compression/expansion device 501 according to the fifth embodiment addresses the problem.

Figure 31:
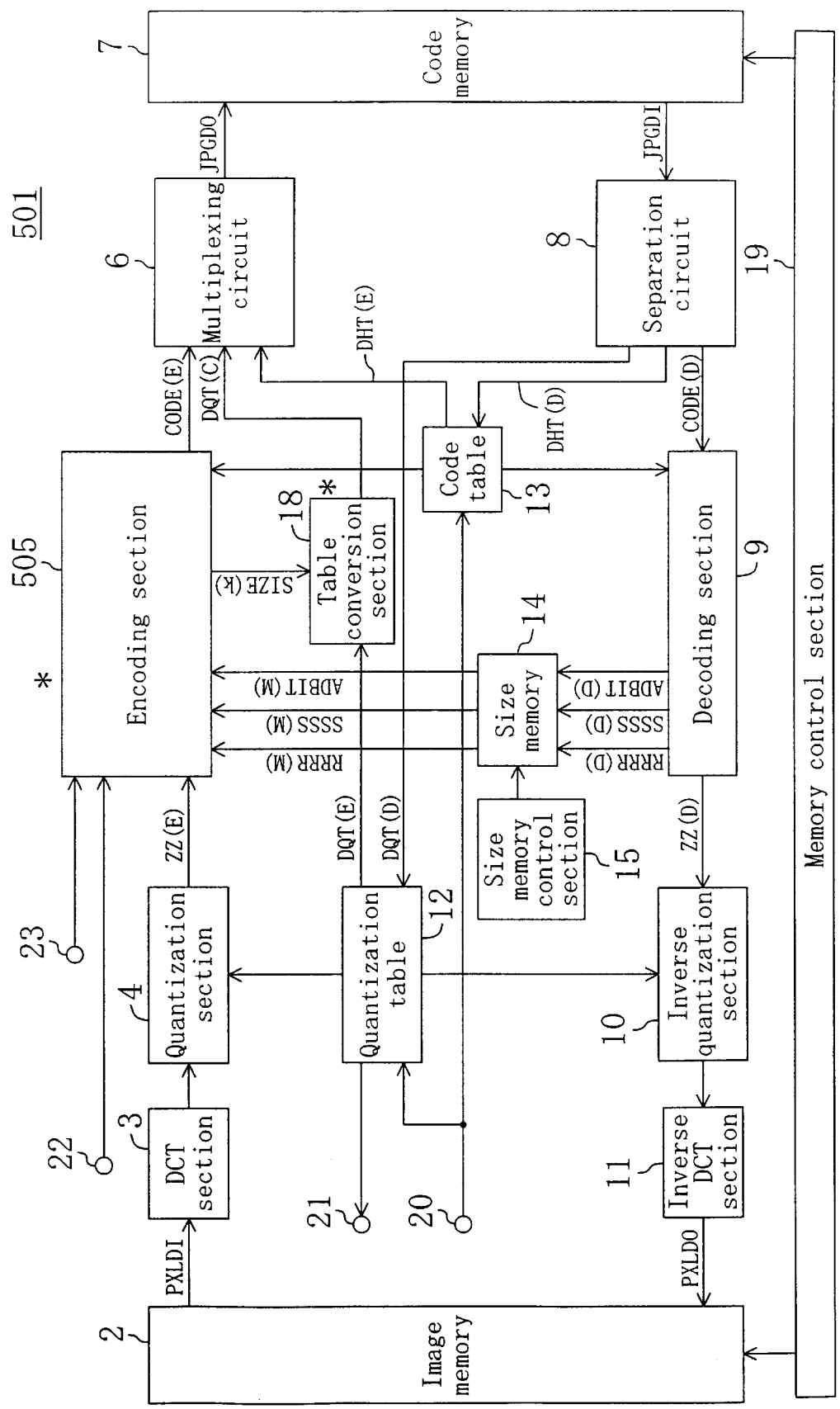
FIG. 31 is a block diagram illustrating an overall configuration of an image compression/expansion device according to the fifth embodiment of the present invention.

FIG. 31 is a block diagram illustrating an overall configuration of the image compression/expansion device 501 according to the fifth embodiment of the present invention. Referring to FIG. 31, the image compression/expansion device 501 includes a table conversion section 18 in addition to the configuration of the image compression/expansion device 1 illustrated in FIG. 1, and also includes an encoding section 505 illustrated in FIG. 32 instead of the encoding section 5 illustrated in FIG. 1. The encoding section 505 illustrated in FIG. 32 has an internal configuration as that of the encoding section 5 illustrated in FIG. 1, but differs from the encoding section 5 in that a frequency region and a size conversion amount SIZE(k) which are set in the size conversion table 5e are supplied to the table conversion section 18.

The table conversion section 18 converts quantization step values DQT(F) set in the quantization table 12 based on the frequency region and the size conversion amount SIZE (k) set in the size conversion table 5e, and outputs the converted quantization step values to the multiplexing circuit 6.

A case where the quantization step values as illustrated in FIG. 4 are set in the quantization table 12 (FIG. 31), and the frequency region and the conversion amount as illustrated in FIG. 14 are set in the size conversion table 5e (FIG. 32), will be described below.

Figures 32, 33:
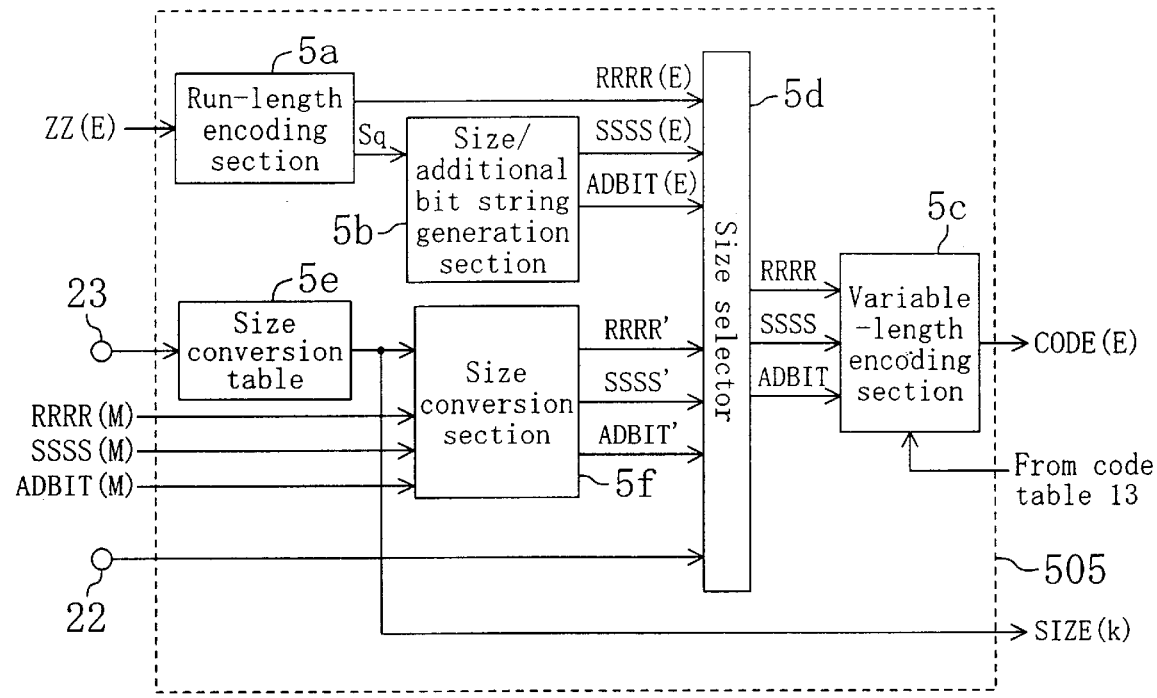
FIG. 32 is a block diagram illustrating an internal configuration of an encoding section illustrated in FIG. 31.
FIG. 33 is a diagram illustrating quantization step values after conversion by the table conversion section illustrated in FIG. 31.

If a size SSSS(M) corresponding to the frequency region in FIG. 14 where a size conversion amount of −2 is set is 4, the size SSSS (C) is 2 as a result of the conversion by the size conversion section 5f (FIG. 32). Referring to FIG. 11, as a result of the size conversion, the range of the effective coefficient Sq is converted to a range of the effective coefficients before conversion divided by 4. Specifically, the range before the conversion is −15, . . . , −8, 8, . . . , 15, and the range after the conversion is −3(−15/4), −2(−8/4), 2(8/4), 3(15/4). Therefore, among the quantization step values illustrated in FIG. 4, those within the frequency region in FIG. 14 where a size conversion amount of −2 is set are shifted by two bits to the left. Thus, because the value of the effective coefficient Sq is multiplied by 1/4 through the size conversion operation, the corresponding quantization step value is output after it is multiplied by 4. Similarly, those quantization step values within the frequency region in FIG. 14 where a size conversion amount of −1 is set are shifted by one bit to the left. Thus, the corresponding quantization step value is output after it is multiplied by 2.

In this way, a conversion operation is performed by the table conversion section 18, thereby obtaining the converted quantization step values DQT(C) as illustrated in FIG. 33.

Figure 34:
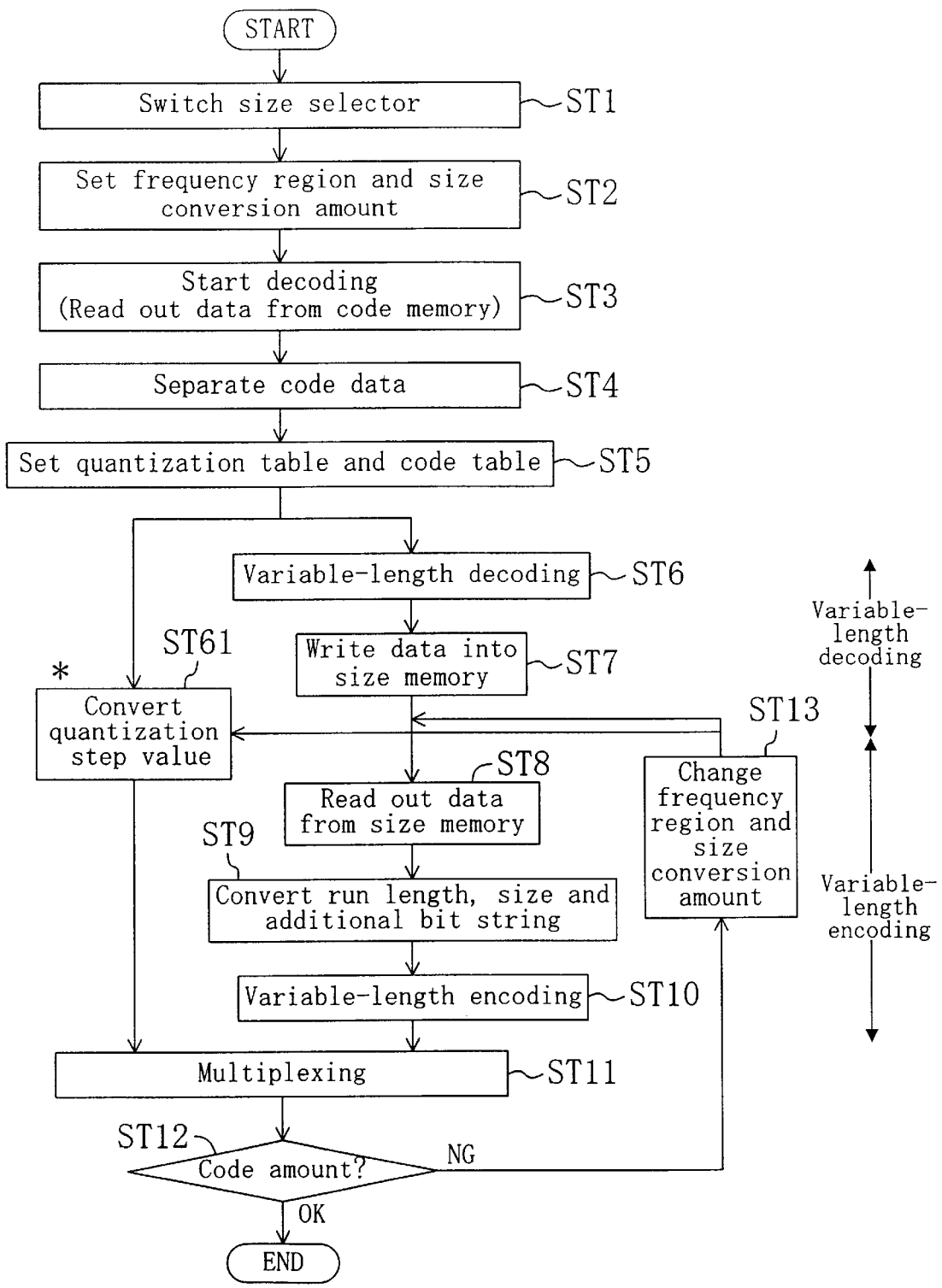
FIG. 34 is a flow chart illustrating a procedure of a code amount changing operation by the image compression/expansion device illustrated in FIG. 31.

Then, a code amount changing operation by the image compression/expansion device 501 according to the fifth embodiment will be described with reference to FIG. 34. Note that only step ST61, which is not present in the operation of the first embodiment as illustrated in FIG. 13, will be described.

In step ST61, the table conversion section 18 (FIG. 31) converts the quantization step values DQT(F) set in the quantization table 12 (FIG. 31) based on the frequency region and the size conversion amount SIZE(k) set in the size conversion table 5e (FIG. 32). In step ST12, various information required for compression such as the converted quantization step values DQT(C), the variable-length codes CODE(E) and the code table information DHT(E) set in the code table 13 (FIG. 31) are multiplexed together to produce compressed image data JPGDO.

Moreover, when the values in the size conversion table are changed in step ST13, step ST61 is performed again.

As described above, the image compression/expansion device 501 according to the fifth embodiment is provided with the table conversion section 18, whereby the quantization step values are changed according to the values set in the size conversion table 5e. As a result, it is possible to suppress the deterioration in a recovered image which may occur when the produced compressed image data is expanded. Moreover, it is no longer necessary to confine the frequency region for which the size is to be converted to a high frequency region as much as possible.

Note that the table conversion section 18 can similarly be applied to any of the image compression/expansion devices of the second to fourth embodiments.

Sixth Embodiment

With the image compression/expansion devices of the first to fifth embodiments, all of the run length/size/additional bit string combinations or all of the run length/effective coefficient combinations obtained by a decoding section for one entire image are written into a size memory or a coefficient memory, after which these data are sequentially read out to sequentially convert the sizes and/or the effective coefficients. However, such an operation requires a size memory or a coefficient memory of a very large capacity. The sixth embodiment addresses the problem.

Figure 35:
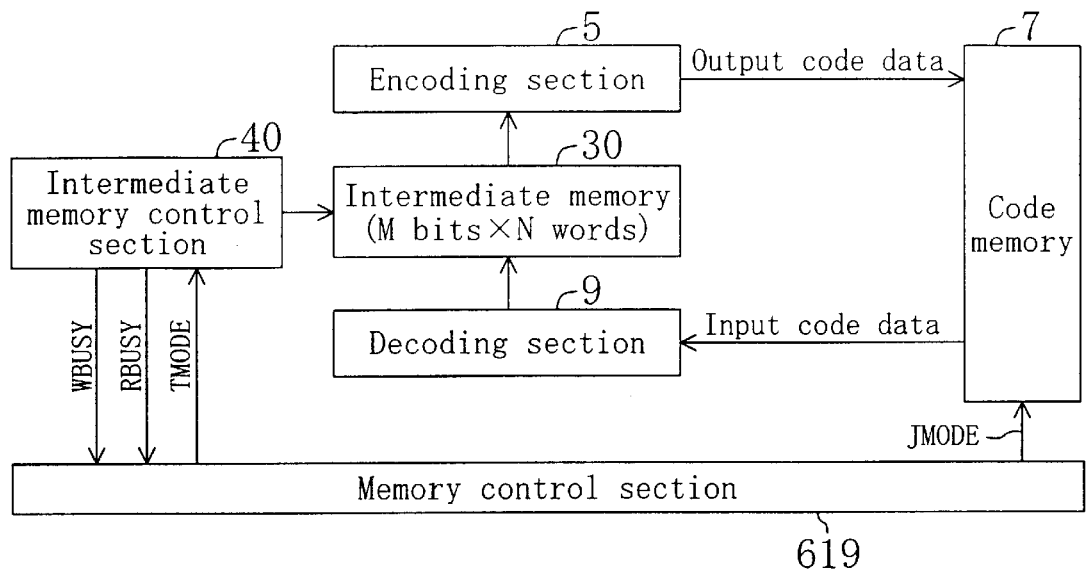
FIG. 35 is a block diagram illustrating a configuration of a main part of an image compression/expansion device according to the sixth embodiment of the present invention.

FIG. 35 is a block diagram illustrating a main part of an image compression/expansion device according to the sixth embodiment of the present invention. Referring to FIG. 35, the image compression/expansion device includes an intermediate memory 30, an intermediate memory control section 40 and a memory control section 619 instead of the size memory 14, the size memory control section 15 and the memory control section 19 illustrated in FIG. 1.

The intermediate memory 30 is a memory having a limited capacity of M bits×N words. The capacity of M bits×N words is smaller than the total capacity of the run length RRRR(D)/size SSSS (D)/additional bit string ADBIT (D) combinations for one entire image obtained by the decoding section 9. The intermediate memory control section 40 controls writing/reading of data to/from the intermediate memory 30. The memory control section 619 controls writing/reading of data to/from the code memory 7. The intermediate memory control section 40 and the memory control section 619 exchange signals WBUSY, RBUSY and TMODE therebetween.

Figure 36:
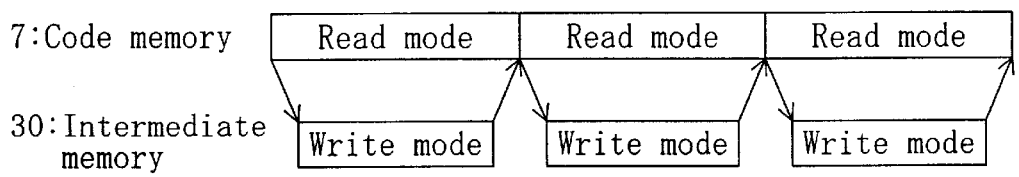
FIG. 36 is a diagram illustrating an operation of the image compression/expansion device according to the sixth embodiment of the present invention.

Next, an operation of the image compression/expansion device having such a configuration will be described with reference to FIG. 35 and FIG. 36.

First, the memory control section 619 gives a first level mode specification signal JMODE to the code memory 7. In response to the first level mode specification signal JMODE, the code memory 7 is set in the read mode, whereby code data is read out from the code memory 7. At the same time, the memory control section 619 gives a first level mode specification signal TMODE to the intermediate memory control section 40. In response to the first level mode specification signal TMODE, the intermediate memory control section 40 sets the intermediate memory 30 in the write mode. Thus, variable-length codes are sequentially input from the code memory 7 to the decoding section 9, where the variable-length codes are decoded. The run length/size/additional bit string combinations obtained by the decoding section 9 are sequentially written into the intermediate memory 30.

When the intermediate memory 30 becomes full and data can no longer be written into the intermediate memory 30, the intermediate memory control section 40 gives the write busy signal WBUSY to the memory control section 619. In response to the write busy signal WBUSY, the memory control section 619 gives a second level mode specification signal JMODE to the code memory 7. In response to the second level mode specification signal JMODE, the code memory 7 is set in the write mode. At the same time, the memory control section 619 gives a second level mode specification signal TMODE to the intermediate memory control section 40. In response to the second level mode specification signal TMODE, the intermediate memory control section 40 sets the intermediate memory 30 in the read mode. Thus, the run length/size/additional bit string combinations stored in the intermediate memory 30 are sequentially read out, and subjected to a size conversion operation and a variable-length encoding operation by the encoding section 5. The produced variable-length codes are written into the code memory 7.

When the intermediate memory 30 runs out of data to be read out therefrom, the intermediate memory control section 40 gives a read busy signal RBUSY to the memory control section 619. In response to this, the memory control section 619 gives the first level mode specification signal JMODE to the code memory 7. In response to the first level mode specification signal JMODE, the code memory 7 is set in the read mode, whereby code data is read out from the code memory 7. At the same time, the memory control section 619 gives the first level mode specification signal TMODE to the intermediate memory control section 40. In response to the first level mode specification signal TMODE, the intermediate memory control section 40 sets the intermediate memory 30 in the write mode. Thus, variable-length codes are sequentially input from the code memory 7 to the decoding section 9, where the variable-length codes are decoded. The run length/size/additional bit string combinations obtained by the decoding section 9 are sequentially written into the intermediate memory 30.

Thereafter, the operation as described above is repeated.

As described above, according to the sixth embodiment, the encoding operation and the decoding operation can be alternately performed in a time division manner. Thus, it is possible to reduce the capacity that is required for a storage device (the size memory) for temporarily storing the run length/size combinations, the additional bit strings or the run length/effective coefficient combinations obtained by the decoding operation.

Note that while the sixth embodiment is applied to the image compression/expansion device 1 illustrated in FIG. 1 in the above description, it can similarly be applied to any of the other image compression/expansion devices of the second to fifth embodiments.

Seventh Embodiment

Figure 37:
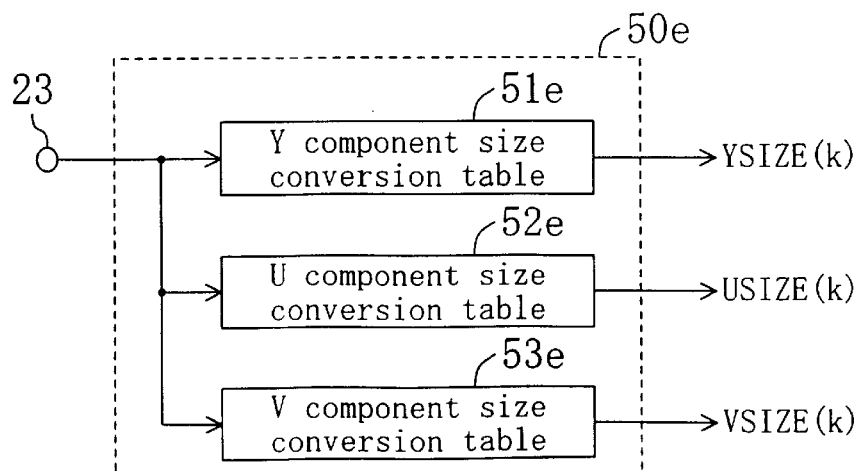
FIG. 37 is a block diagram illustrating a configuration of a size conversion table in an image compression/expansion device according to the seventh embodiment of the present invention.

An image compression/expansion device according to the seventh embodiment of the present invention includes a size conversion table 50e illustrated in FIG. 37 instead of the size conversion table 5e illustrated in FIG. 2.

Referring to FIG. 37, the size conversion table 50e includes a Y component size conversion table 51e, a U component size conversion table 52e and a V component size conversion table 53e.

The Y component size conversion table 51e is a size conversion table for the luminance component Y. The U component size conversion table 52e is a size conversion table for the U component of the color difference components. The V component size conversion table 53e is a size conversion table for the V component of the color difference components. Exemplary settings for the tables 51e to 53e are illustrated in FIG. 38A to FIG. 38C, respectively.

Human eyes are very sensitive to changes in the luminance component (Y component), but are relatively insensitive to changes in the color difference components (U component and V component). Accordingly, the Y component size conversion table has a small frequency region L5 (for which a conversion is to be performed) and a small size conversion amount, whereas the U and V component size conversion tables have large frequency regions L6 and L7 (for which a conversion is to be performed) and a large size conversion amount as illustrated in FIG. 38A to FIG. 38C. In this way, it is possible to reduce the code amount in such a manner that the deterioration in the image quality due to the conversion is less perceivable by human eyes.

Figure 39:
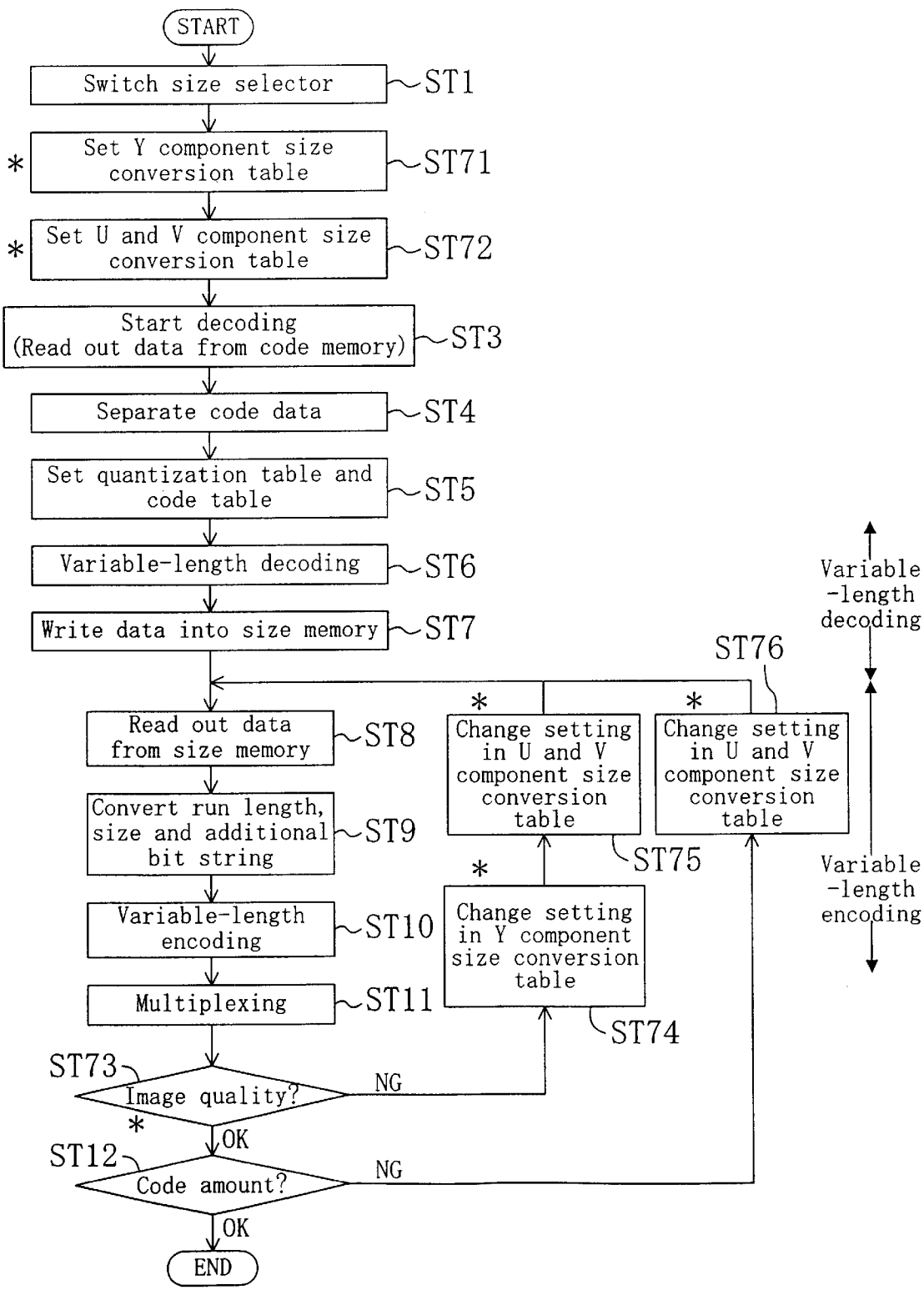
FIG. 39 is a flow chart illustrating a procedure of a code amount changing operation by the image compression/expansion device according to the seventh embodiment of the present invention.

Next, the flow of a code amount changing operation by the image compression/expansion device according to the seventh embodiment will be described with reference to FIG. 39. Note that steps ST71–ST76, which are not present in the operation of the first embodiment as illustrated in FIG. 13, will be focused on in the following description.

First, in step ST71, a frequency region and a size conversion amount (e.g., the frequency region L5 and the size conversion amount as illustrated in FIG. 38A) are set in the Y component size conversion table 51e.

Then, in step ST72, a frequency region and a size conversion amount (e.g.,the frequency regions L6 and L7 and the size conversion amounts as illustrated in FIG. 38B and FIG. 38C, respectively) are set in the U component size conversion table 52e and the V component size conversion table 53e.

Then, in steps ST3–ST8, the operation as described above in the first embodiment is performed.

Then, in step ST9, the size conversion section 5f (FIG. 2) sequentially converts the run length RRRR(M), the size SSSS(M) and the additional bit string ADBIT(M) of the Y component based on the frequency region and the size conversion amount set in the Y component size conversion table 51e. Moreover, the size conversion section 5f sequentially converts the run length RRRR(M), the size SSSS(M) and the additional bit string ADBIT(M) of the U component based on the frequency region and the size conversion amount set in the U component size conversion table 52e. Furthermore, the size conversion section 5f sequentially converts the run length RRRR(M), the size SSSS(M) and the additional bit string ADBIT(M) of the V component based on the frequency region and the size conversion amount set in the V component size conversion table 53e.

Then, in steps ST10 and ST11, the operation as described above in the first embodiment is performed.

Then, in step ST73, it is determined whether the deterioration in the image quality of the obtained compressed image data is within an acceptable range. If the deterioration is within the acceptable range, the process proceeds to step ST12. If it is determined that the deterioration is not within the acceptable range, the process proceeds to step ST74.

Then, in step ST74, the frequency region and the size conversion amount which are set in the Y component size conversion table 51e are changed. Moreover, in step ST75, the frequency regions and the size conversion amounts which are set in the U component size conversion table 52e and the V component size conversion table 53e are changed. Thereafter, steps ST8–ST73 are performed again. In this way, the deterioration in the image quality can be controlled within an acceptable range.

Then, in step ST12, it is determined whether the code amount of the obtained compressed image data is a desired value. If it is a desired value, the process is terminated. If it is not a desired value, the process proceeds to step ST76.

Then, in step ST76, the frequency regions and the size conversion amounts which are set in the U component size conversion table 52e and the V component size conversion table 53e are changed. Then, steps ST8–ST12 are performed again. As described above, steps ST8–ST12 are repeated while changing the frequency regions and the size conversion amounts in the U component size conversion table 52e and the V component size conversion table 53e until the code amount of the produced compressed image data is a desired value. Thus, it is possible to obtain compressed image data having a desired code amount.

As described above, with the image compression/expansion device according to the seventh embodiment, it is possible to control the degree of deterioration in the image quality while obtaining compressed image data of a desired code amount.

Note that the set of size conversion tables respectively corresponding to the color components may similarly be used in place of the size conversion table of any of the image compression/expansion devices of the second, fifth and sixth embodiments described above. Moreover, the code amount changing procedure as described above may also be used, whereby effects as those obtained in the present embodiment can be obtained.

Eighth Embodiment

Figure 40:
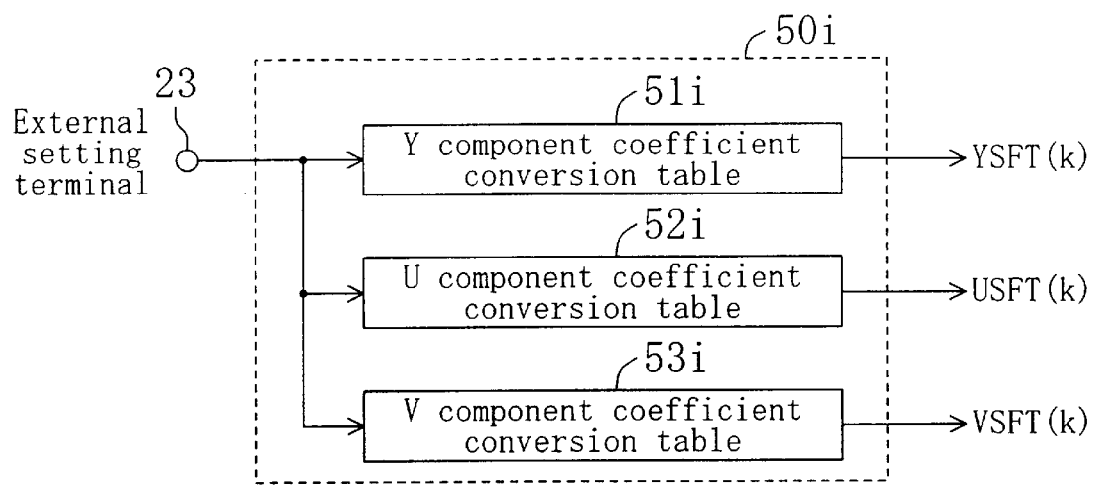
FIG. 40 is a block diagram illustrating a configuration of a coefficient conversion table in an image compression/expansion device according to the eighth embodiment of the present invention.

An image compression/expansion device according to the eighth embodiment of the present invention includes a coefficient conversion table 50i illustrated in FIG. 40 instead of the coefficient conversion table 5i illustrated in FIG. 23.

Referring to FIG. 40, the coefficient conversion table 50i includes a Y component coefficient conversion table 51i, a U component coefficient conversion table 52i and a V component coefficient conversion table 53i.

The Y component coefficient conversion table 51i is a conversion table for the luminance component Y. The U component coefficient conversion table 52i is a conversion table for the U component of the color difference components. The V component coefficient conversion table 53i is a conversion table for the V component of the color difference components. Exemplary settings for the tables 51i to 53i are illustrated in FIG. 41A to FIG. 41C, respectively.

Human eyes are very sensitive to changes in the luminance component (Y component), but are relatively insensitive to changes in the color difference components (U component and V component). Accordingly, the Y component coefficient conversion table has a small frequency region L8 (for which a conversion is to be performed) and a small coefficient conversion amount, whereas the U and V component coefficient conversion tables have large frequency regions L9 and L10 (for which a conversion is to be performed) and a large coefficient conversion amount as illustrated in FIG. 41A to FIG. 41C. In this way, it is possible to reduce the code amount in such a manner that the deterioration in the image quality due to the conversion is less perceivable by human eyes.

Figure 42:
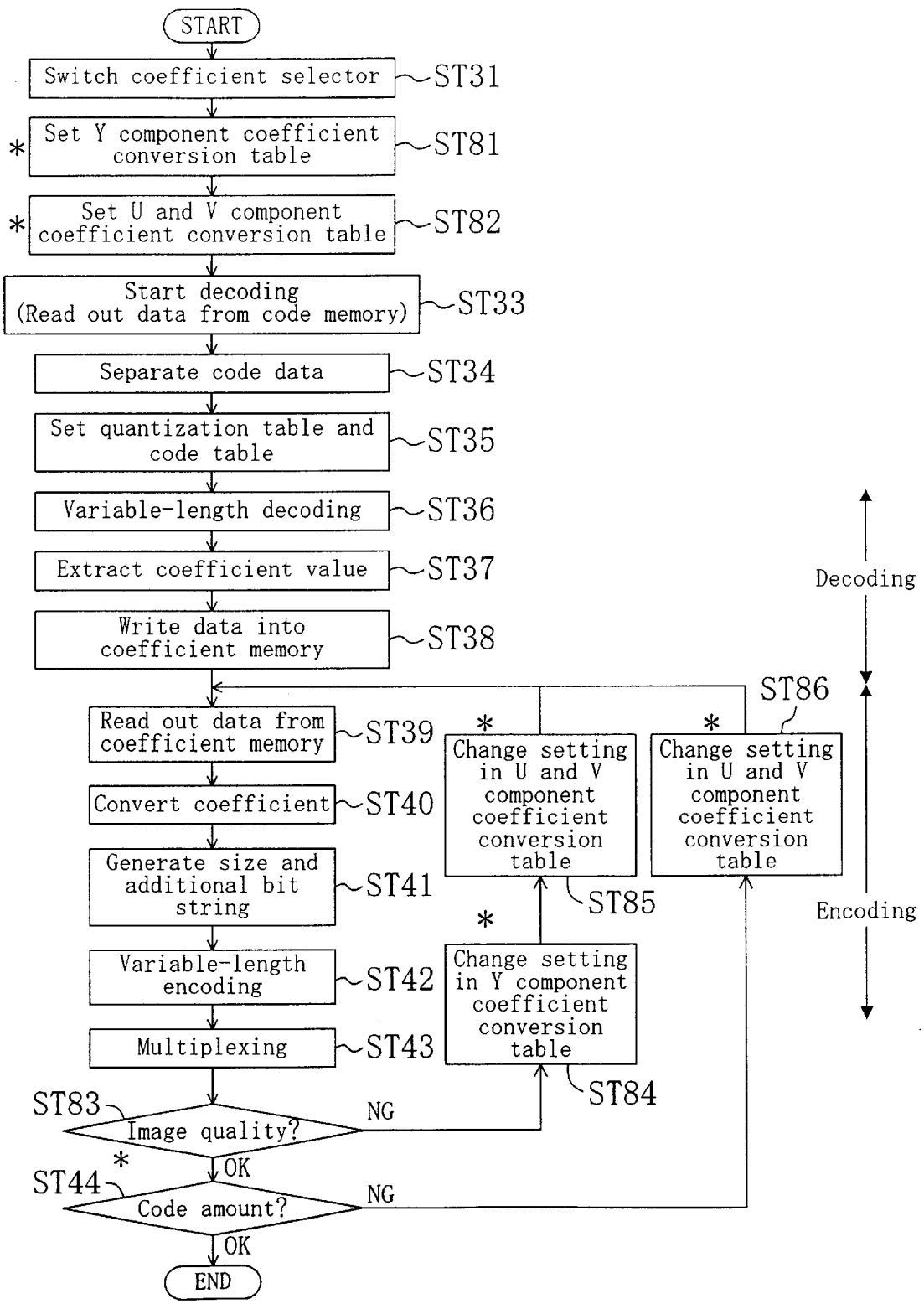
FIG. 42 is a flow chart illustrating a procedure of a code amount changing operation by the image compression/expansion device according to the eighth embodiment of the present invention.
Figure 43:
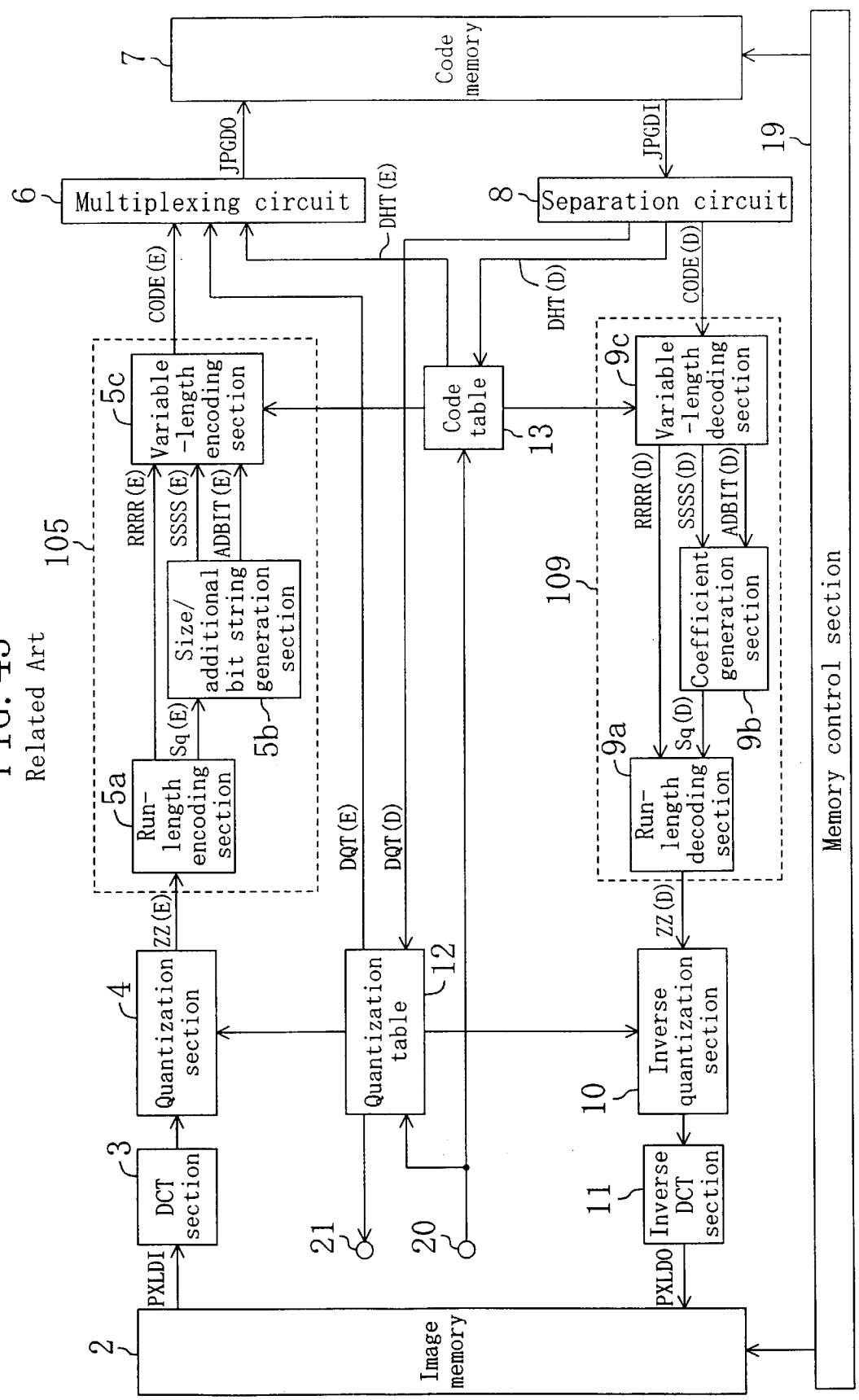
FIG. 43 is a block diagram illustrating an overall configuration of a conventional image compression/expansion device.

Next, the flow of a code amount changing operation by the image compression/expansion device according to the eighth embodiment will be described with reference to FIG. 42. Note that steps ST81–ST86, which are not present in the operation of the third embodiment as illustrated in FIG. 25, will be focused on in the following description.

First, in step ST81, a frequency region and a coefficient conversion amount (e.g., the frequency region L8 and the coefficient conversion amount as illustrated in FIG. 41A) are set in the Y component coefficient conversion table 51i.

Then, in step ST82, a frequency region and a coefficient conversion amount (e.g., the frequency regions L9 and L10 and the coefficient conversion amounts as illustrated in FIG. 41B and FIG. 41C, respectively) are set in the U component coefficient conversion table 52i and the V component coefficient conversion table 53i.

Then, in steps ST33–ST39, the operation as described above in the third embodiment is performed.

Then, in step ST40, the coefficient conversion section 5j (FIG. 23) sequentially converts the run length RRRR(M) and the effective coefficient Sq(M) of the Y component based on the frequency region and the coefficient conversion amount set in the Y component coefficient conversion table 51i. Moreover, the coefficient conversion section 5j sequentially converts the run length RRRR(M) and the effective coefficient Sq(M) of the U component based on the frequency region and the coefficient conversion amount set in the U component coefficient conversion table 52i. Furthermore, the coefficient conversion section 5j sequentially converts the run length RRRR(M) and the effective coefficient Sq(M) of the V component based on the frequency region and the coefficient conversion amount set in the V component coefficient conversion table 53i.

Then, in steps ST41–ST43, the operation as described above in the third embodiment is performed.

Then, in step ST83, it is determined whether the deterioration in the image quality of the obtained compressed image data is within an acceptable range. If the deterioration is within the acceptable range, the process proceeds to step ST44. If it is determined that the deterioration is not within the acceptable range, the process proceeds to step ST84.

Then, in step ST84, the frequency region and the coefficient conversion amount which are set in the Y component coefficient conversion table 51i are changed. Moreover, in step ST85, the frequency regions and the coefficient conversion amounts which are set in the U component coefficient conversion table 52i and the V component coefficient conversion table 53i are changed. Thereafter, steps ST39–ST83 are performed again. In this way, the deterioration in the image quality can be controlled within an acceptable range.

Then, in step ST44, it is determined whether the code amount of the obtained compressed image data is a desired value. If it is a desired value, the process is terminated. If it is not a desired value, the process proceeds to step ST86.

Then, in step ST86, the frequency regions and the coefficient conversion amounts which are set in the U component coefficient conversion table 52i and the V component coefficient conversion table 53$i$ are changed. Then, steps ST39–ST44 are performed again. As described above, steps ST39–ST44 are repeated while changing the frequency regions and the coefficient conversion amounts in the U component coefficient conversion table 52$i$ and the V component coefficient conversion table 53$i$ until the code amount of the produced compressed image data is a desired value. Thus, it is possible to obtain compressed image data having a desired code amount.

As described above, with the image compression/expansion device according to the eighth embodiment, it is possible to control the degree of deterioration in the image quality while obtaining compressed image data of a desired code amount.

Note that the set of coefficient conversion tables respectively corresponding to the color components may similarly be used in place of the coefficient conversion table of any of the image compression/expansion devices of the fourth and sixth embodiments described above. Moreover, the code amount changing procedure as described above may also be used, whereby effects as those obtained in the present embodiment can be obtained.

What is claimed is:

1. An encoding device for changing a code amount of compressed image data which has been produced by performing a Discrete Cosine Transform (hereinafter referred to as "DCT") operation, a quantization operation, a run-length encoding operation and a variable-length encoding operation on original image data, the encoding device comprising:

separation means for separating the compressed image data into variable-length codes, quantization step values and code table information representing a correspondence between combinations of run length and size and code words;

decoding means for decoding each of the variable-length codes from the separation means into a run length, a size and an additional bit string based on the code table information;

a size conversion table in which a frequency region and a size conversion amount are set;

size conversion means for performing a conversion operation on the run length, the size and the additional bit string obtained by the decoding means based on the frequency region and the size conversion amount set in the size conversion table;

variable-length encoding means for performing a variable-length encoding operation on the run length, the size and the additional bit string converted by the size conversion means based on the code table information; and multiplexing means for multiplexing together variable-length codes obtained by the variable-length encoding means, the quantization step values and the code table information.

2. The encoding device of claim 1, further comprising means for specifying a combination of run length and size to be converted, wherein the size conversion means performs the conversion operation when the run length and the size obtained by the decoding means match the combination specified by the specification means.

3. The encoding device of claim 1, further comprising means for changing the quantization step values based on the frequency region and the size conversion amount set in the size conversion table, wherein the multiplexing means multiplexes together the quantization step values changed by the changing means, the variable-length codes obtained by the variable-length encoding means and the code table information.

4. The encoding device of claim 1, wherein:

the size conversion table includes:

a luminance component conversion table in which a first frequency region and a first size conversion amount are set; and a color difference component conversion table in which a second frequency region and a second size conversion amount are set; and the size conversion means converts each combination of run length, size and additional bit string for a luminance component among the run lengths, the sizes and the additional bit strings obtained by the decoding means based on the first frequency region and the first size conversion amount, and converts each combination of run length, size and additional bit string for a color difference component among the run lengths, the sizes and the additional bit strings obtained by the decoding means based on the second frequency region and the second size conversion amount.

5. The encoding device of claim 1, further comprising a size memory for storing the run length, the size and the additional bit string obtained by the decoding means, wherein the size conversion means converts the run length, the size and the additional bit string which are read out from the size memory based on the frequency region and the size conversion amount set in the size conversion table.

6. The encoding device of claim 5, further comprising:

a code memory for storing compressed image data; and memory control means for controlling writing/reading of data to/from the size memory and the code memory, wherein the memory control means sets the code memory in a read mode and the size memory in a write mode when the size memory runs out of the run length, the size and the additional bit string to be read out therefrom, whereas the memory control means sets the size memory in the read mode and the code memory in the write mode when the size memory runs out of a space for writing the run length, the size and the additional bit string.

7. An encoding device for changing a code amount of compressed image data which has been produced by performing a DCT operation, a quantization operation, a run-length encoding operation and a variable-length encoding operation on original image data, the encoding device comprising:

separation means for separating the compressed image data into variable-length codes, quantization step values and code table information representing a correspondence between combinations of run length and size and code words;

decoding means for decoding each of the variable-length codes from the separation means into a run length, a size and an additional bit string based on the code table information;

coefficient generation means for specifying an effective coefficient based on the size and the additional bit string obtained by the decoding means;

a coefficient conversion table in which a frequency region and a coefficient conversion amount are set;

coefficient conversion means for performing a conversion operation on the run length obtained by the decoding means and the effective coefficient specified by the coefficient generation means based on the frequency region and the coefficient conversion amount set in the coefficient conversion table;

size/additional bit string generation means for assigning a size and an additional bit string to the effective coefficient converted by the coefficient conversion means;

variable-length encoding means for performing a variable-length encoding operation on the run length converted by the coefficient conversion means and the size and the additional bit string assigned by the size/additional bit string generation means based on the code table information; and multiplexing means for multiplexing together variable-length codes obtained by the variable-length encoding means, the quantization step values and the code table information.

8. The encoding device of claim 7, further comprising means for specifying a combination of run length and effective coefficient to be converted, wherein the coefficient conversion means performs the conversion operation when the run length obtained by the decoding means and the effective coefficient specified by the coefficient generation means match the combination specified by the specification means.

9. The encoding device of claim 7, further comprising means for changing the quantization step values based on the frequency region and the coefficient conversion amount set in the coefficient conversion table, wherein the multiplexing means multiplexes together the quantization step values changed by the changing means, the variable-length codes obtained by the variable-length encoding means and the code table information.

10. The encoding device of claim 7, wherein:

the coefficient conversion table includes:

a luminance component conversion table in which a first frequency region and a first coefficient conversion amount are set; and a color difference component conversion table in which a second frequency region and a second coefficient conversion amount are set; and the coefficient conversion means converts each combination of run length and effective coefficient for a luminance component among the run lengths obtained by the decoding means and the effective coefficients specified by the coefficient generation means based on the first frequency region and the first coefficient conversion amount, and converts each combination of run length and effective coefficient for a color difference component among the run lengths obtained by the decoding means and the effective coefficients specified by the coefficient generation means based on the second frequency region and the second coefficient conversion amount.

11. The encoding device of claim 7, further comprising a coefficient memory for storing the run length obtained by the decoding means and the effective coefficient specified by the coefficient generation means, wherein the coefficient conversion means converts the run length and the effective coefficient which are read out from the coefficient memory based on the frequency region and the coefficient conversion amount set in the coefficient conversion table.

12. The encoding device of claim 11, further comprising:

a code memory for storing compressed image data; and memory control means for controlling writing/reading of data to/from the coefficient memory and the code memory, wherein the memory control means sets the code memory in a read mode and the coefficient memory in a write mode when the coefficient memory runs out of the run length and the effective coefficient to be read out therefrom, whereas the memory control means sets the coefficient memory in the read mode and the code memory in the write mode when the coefficient memory runs out of a space for writing the run length and the effective coefficient.

13. An encoding method for changing a code amount of compressed image data which has been produced by performing a DCT operation, a quantization operation, a run-length encoding operation and a variable-length encoding operation on original image data, the encoding method comprising:

a step of separating the compressed image data into variable-length codes, quantization step values and code table information representing a correspondence between combinations of run length and size and code words;

a step of decoding each of the variable-length codes into a run length, a size and an additional bit string based on the code table information;

a step of setting a frequency region and a size conversion amount;

a step of performing a conversion operation on the run length, the size and the additional bit string obtained in the decoding step based on the frequency region and the size conversion amount which have been set;

a step of performing a variable-length encoding operation on the run length, the size and the additional bit string converted in the conversion step based on the code table information; and a step of multiplexing together variable-length codes obtained in the variable-length encoding step, the quantization step values and the code table information, wherein if a code amount of compressed image data obtained in the multiplexing step is not a desired value, the frequency region and/or the size conversion amount set in the setting step are/is changed, and the conversion step, the variable-length encoding step and the multiplexing step are performed again.

14. An encoding method for changing a code amount of compressed image data which has been produced by performing a DCT operation, a quantization operation, a run-length encoding operation and a variable-length encoding operation on original image data, the encoding method comprising:

a step of separating the compressed image data into variable-length codes, quantization step values and code table information representing a correspondence between combinations of run length and size and code words;

a step of decoding each of the variable-length codes into a run length, a size and an additional bit string based on the code table information;

a step of specifying an effective coefficient based on the size and the additional bit string obtained in the decoding step;

a step of setting a frequency region and a coefficient conversion amount;

a step of converting the run length obtained in the decoding step and the effective coefficient specified by the specification step based on the frequency region and the coefficient conversion amount which have been set;

a step of assigning a size and an additional bit string to the effective coefficient converted in the conversion step;

a step of performing a variable-length encoding operation on the run length converted in the conversion step and the size and the additional bit string assigned in the assignment step based on the code table information; and a step of multiplexing together variable-length codes obtained in the variable-length encoding step, the quantization step values and the code table information, wherein if a code amount of compressed image data obtained in the multiplexing step is not a desired value, the frequency region and/or the coefficient conversion amount set in the setting step are/is changed, and the conversion step, the assignment step, the variable-length encoding step and the multiplexing step are performed again.

* * * * *